(12) United States Patent
Shibata et al.

(10) Patent No.: US 8,901,539 B2
(45) Date of Patent: Dec. 2, 2014

(54) ORGANIC ELECTROLUMINESCENCE DEVICE AND LUMINESCENCE APPARATUS

(75) Inventors: Kazuyuki Shibata, Tokyo (JP); Masaru Kinoshita, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 817 days.

(21) Appl. No.: 12/634,670

(22) Filed: Dec. 9, 2009

(65) Prior Publication Data

US 2010/0140606 A1 Jun. 10, 2010

(30) Foreign Application Priority Data

Dec. 10, 2008 (JP) ................. 2008-314813

(51) Int. Cl.
*H01L 29/08* (2006.01)
*H01L 51/50* (2006.01)
*H01L 51/00* (2006.01)

(52) U.S. Cl.
CPC ........ *H01L 51/5016* (2013.01); *H01L 51/5036* (2013.01); *H01L 51/0087* (2013.01); *H01L 2251/552* (2013.01); *H01L 51/0085* (2013.01)
USPC ............................................. 257/40; 438/99

(58) Field of Classification Search
USPC .............................................. 257/40; 438/99
See application file for complete search history.

(56) References Cited

FOREIGN PATENT DOCUMENTS

| JP | 2001-319780 A | 11/2001 |
| JP | 2002-100476 A | 4/2002 |
| JP | 2007-027092 A | 2/2007 |

OTHER PUBLICATIONS

D'Andrade, B.W., et al. "Controlling Exciton Diffusion in Multilayer White Phosphorescent Organic Light Emitting Devices." Adv. Mater., vol. 14, No. 2 (Jan. 16, 2002): pp. 147-151.*
Holmes, R.J., et al. "Blue Organic Electrophosphorescence Using Exothermic Host-Guest Energy Transfer." Appl. Phys. Lett., vol. 82, No. 15 (Apr. 14, 2003): pp. 2422-2424.*
Kafafi, Z. Organic Electroluminescence. Taylor & Francis: Boca Raton, FL (2005): pp. 276-286.*
Tokito, S., et al. "High-Efficiency Blue and White Phosphorescent Organic Light-Emitting Devices." Curr. Appl. Phys., vol. 5 (2005): pp. 331-336.*
Ultrahigh Energy Gap Hosts in Deep Blue Organic Electrophosphorescent Devices, Xiaofan Ren,Jian Li,Russell J. Holmes,Peter I. Djurovich,Stephen R. Forrest, and Mark E. Thompson, Chemistry of Materials 2004 16 (23), 4743-4747.*
Efficient Organic Electrophorescent White-Light-Emitting Device with a Triple Doped Emissive Layer, Brian W. D'Andrade, Russell J. Holmes, and Stephen R. Forrest, Adv. Mater. 2004, 16, No. 7, Apr. 5, 624-628.*

* cited by examiner

*Primary Examiner* — Mark Tornow
(74) *Attorney, Agent, or Firm* — Riverside Law LLP

(57) ABSTRACT

The invention provides an organic EL device including a pair of electrodes and at least one luminescent layer located between the pair of electrodes, the luminescent layer including a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material, the charge-transporting material having a lowest excited triplet energy level (T1) of 2.7 eV or more, and the T1 of the charge-transporting material being higher than the T1 of the blue phosphorescent material by 0.08 eV or more.

12 Claims, 1 Drawing Sheet

LIGHT

LIGHT

US 8,901,539 B2

ORGANIC ELECTROLUMINESCENCE DEVICE AND LUMINESCENCE APPARATUS

CROSS-REFERENCE TO RELATED APPLICATION

This application claims priority under 35 USC 119 from Japanese Patent Application No. 2008-314813 filed Dec. 10, 2008, the disclosure of which is incorporated by reference herein.

TECHNICAL FIELD

The present invention relates to an organic electroluminescence device and a luminescence apparatus.

BACKGROUND ART

Apparatuses employing an organic electrolumimescence device (organic EL device) have been developed in recent years. For example, these apparatuses are formed by providing, on a substrate of glass or the like, an anode, an organic layer (such as a hole-transporting layer, a luminescent layer and an electron-transporting layer), a cathode, or the like, and connecting the same to an external wiring via wirings (terminals) of the two electrodes. When a voltage is applied between the electrodes, excitons are generated in the luminescent layer positioned between the electrodes, as a result of re-combination of holes and electrons, and excessive energy is emitted as light when the excitons return from the excited state to the ground state.

The apparatuses employing the organic EL device as mentioned above can reduce the thickness thereof as compared with display apparatuses employing a liquid crystal or the like. Moreover, when the apparatuses emit white light, these can be applied to a backlight for a liquid crystal display or a illumination device, in addition to a display for a television or a cellular phone.

In order to emit white light using an organic EL device, a method of forming three luminescent layers each emit light of red (R), green (G) and blue (B), respectively, and a method of dispersing three kinds of luminescent materials for RGB in a single luminescent layer, have been known.

For example, Japanese Patent Application Laid-Open (JP-A) No. 2001-319780 proposes a luminescent device having a luminescent layer that includes at least two kinds of luminescent materials, and at least one of these luminescent materials is an ortho-metallized complex, in order to improve luminescence efficiency or brightness as a white light source.

JP-A No. 2002-100476 proposes a luminescent device having a luminescent layer that includes a luminescent material and a host material, the luminescent material having a maximum luminescence peak wavelength of 500 nm, and the host material having a lowest excited triplet energy level that is higher than that of the luminescent material, in order to improve luminescent efficiency and color purity in emitting white light.

JP-A No. 2007-27092 proposes an organic EL device that emits white light, the device having a blue luminescent layer and a mixed luminescent layer of green and red, the mixed luminescent layer including a hole-transporting material, an electron-transporting material, and a phosphorescent material.

SUMMARY OF THE INVENTION

The present invention has been made in view of the above circumstances and provides an organic EL device including a pair of electrodes and at least one luminescent layer located between the pair of electrodes, the luminescent layer including a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material, the charge-transporting material having a lowest excited triplet energy level (T1) of 2.7 eV or more, and the T1 of the charge-transporting material being higher than the T1 of the blue phosphorescent material by 0.08 eV or more.

BRIEF DESCRIPTION OF THE DRAWINGS

Exemplary embodiments of the present invention will be described in detail based on the following figures, wherein.

DETAILED DESCRIPTION OF THE INVENTION

Figure 1:
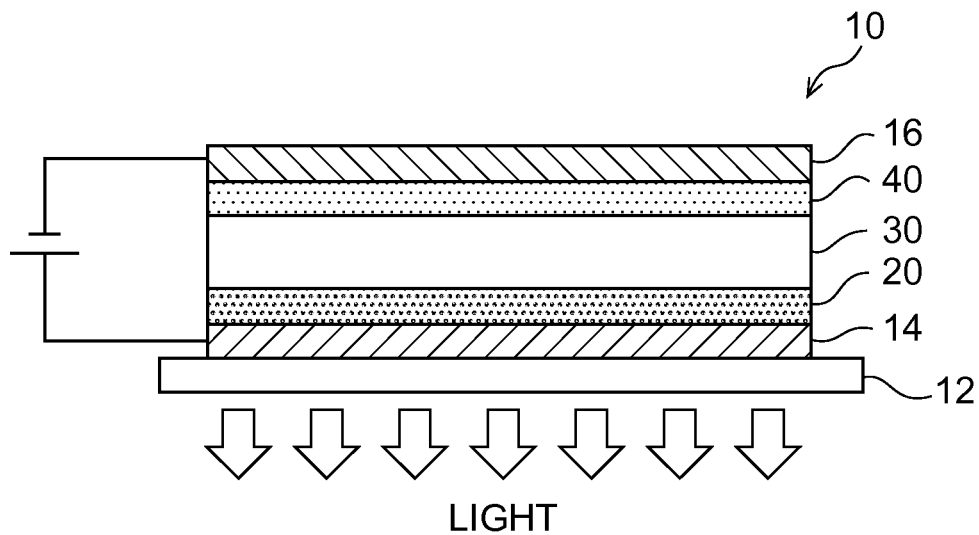
FIG. 1 is a schematic view of an exemplary embodiment (first exemplary embodiment) of the organic EL device according to the invention.

In the following, details of the organic EL device according to the present invention will be described by referring to the attached drawings.

Typically, when producing an organic EL device that emits white light by including luminescent materials for RGB in a luminescent layer, energy of excitons is transferred from the blue luminescent material having a high level of lowest excited triplet energy level (T1) to the green or red luminescent material whose T1 is lower than that of the blue luminescent material. Therefore, when each luminescent material is included in a similar dope concentration, white light is not achieved because of significantly low level of blue light emission. Accordingly, for example, when a luminescent layer is formed by evaporation, the luminescent materials for RGB are co-evaporated such that the dope concentration for B is 15%, the dope concentration for G is 0.13%, and the dope concentration of R is 0.13%. In this case, however, even a slight variation in the evaporation rate for the green and red luminescent materials may easily cause color irregularlities, since these materials are evaporated at a low evaporation rate, while a variation in the dope concentration of blue luminescent material has a relatively small effect. As a result, it is difficult to produce an organic EL device that emits white light in a stable manner.

The present inventors have found, based on an idea that the energy of exitons is transferred from the blue luminescent material to the green and red luminescent materials through an electron-transporting material (host material), that a device that emits white light with less color irregularities can be produced in a stable manner by suppressing the transfer of energy of excitons, by using a host material having a high degree of lowest exited triplet energy level, even while increasing the dope densities of green and red luminescent materials.

Further, the present inventors have found that by separately forming a blue luminescent layer (B luminescent layer) and a mixed luminescent layer of green and red (GR luminescent layer) and by including, in at least one of these layers, a charge-transporting material that suppresses transfer of energy of excitons from the B luminescent layer to the GR luminescent layer, an organic EL device that emits white light with less color irregularities can be produced in a stable manner as a result of suppressing the transfer of energy of excitons, even while increasing the dope densities of green and red luminescent materials.

The organic EL device according to the present invention includes a pair of electrodes and at least one luminescent layer positioned between the pair of electrodes, and the luminescent layer includes a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level of 2.7 eV or more, and this lowest excited triplet energy level being higher than that of the blue phosphorescent material by 0.08 eV or more.

The organic EL device may include other functional layers, as necessary. The following are exemplary layer structures, but the structure of the invention is not limited thereto and may be selected as appropriate according to purposes. The following examples include a structure having a single luminescent layer, and a structure having a first luminescent layer at the anode side and a second luminescent layer at the cathode side. However, the first and second luminescent layers may be located in an inverted manner.

<Exemplary Structures Having a Single Luminescent Layer>

(1) Anode/luminescent layer/cathode (2) Anode/hole-transporting layer/luminescent layer/electron-transporting layer/cathode (3) Anode/hole-transporting layer/luminescent layer/blocking layer/electron-transporting layer/cathode (4) Anode/hole-transporting layer/luminescent layer/blocking layer/electron-transporting layer/electron-injection layer/cathode (5) Anode/hole-injection layer/hole-transporting layer/luminescent layer/blocking layer/electron-transporting layer/cathode (6) Anode/hole-injection layer/hole-transporting layer/luminescent layer/blocking layer/electron-transporting layer/electron-injection layer/cathode (7) Anode/hole-transporting layer/blocking layer/luminescent layer/electron-transporting layer/cathode (8) Anode/hole-transporting layer/blocking layer/luminescent layer/electron-transporting layer/electron-injection layer/cathode (9) Anode/hole-injection layer/blocking layer/hole-transporting layer/luminescent layer/electron-transporting layer/cathode

(10) Anode/hole-injection layer/blocking layer/hole-transporting layer/luminescent layer/electron-transporting layer/electron-injection layer/cathode <Exemplary Structures Having Two Luminescent Layers>

(1) Anode/first luminescent layer/second luminescent layer/cathode (2) Anode/hole-transporting layer/first luminescent layer/second luminescent layer/electron-transporting layer/cathode (3) Anode/hole-transporting layer/first luminescent layer/second luminescent/layer/blocking/layer/electron-transporting layer/cathode (4) Anode/hole-transporting layer/first luminescent layer/second luminescent layer/blocking layer/electron-transporting layer/electron-injection layer/cathode (5) Anode/hole-injection layer/hole-transporting layer/first luminescent layer/second luminescent layer/blocking layer/electron-transporting layer/cathode (6) Anode/hole-injection layer/hole-transporting layer/first luminescent layer/second luminescent layer/blocking layer/electron-transporting layer/electron-injection layer/cathode (7) Anode/hole-transporting layer/blocking layer/first luminescent layer/second luminescent layer/electron-transporting layer/cathode (8) Anode/hole-transporting layer/blocking layer/first luminescent layer/second luminescent layer/electron-transporting layer/electron-injection layer/cathode (9) Anode/hole-injection layer/blocking layer/hole-transporting layer/first luminescent layer/second luminescent layer/electron-transporting layer/cathode

(10) Anode/hole-injection layer/blocking layer/hole-transporting layer/first luminescent layer/second luminescent layer/electron-transporting layer/electron-injection layer/cathode FIG. 1 schematically shows an exemplary structure of the organic EL device according to the invention (first exemplary embodiment). Organic EL device according to the present exemplary embodiment 10 is formed on support substrate 12, and includes a pair of electrodes 14 and 16 located so as to face each other, and an organic layer located between electrodes 14 and 16 (including hole-transporting layer 20, luminescent layer 30 and electron-transporting layer 40).

Figure 2:
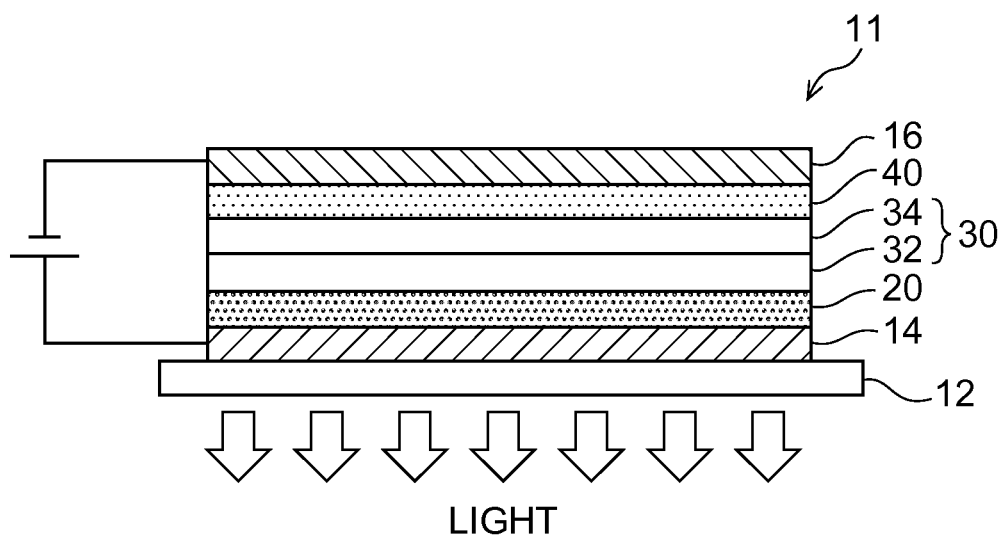
FIG. 2 is a schematic view of another exemplary embodiment (second exemplary embodiment) of the organic EL device according to the invention.

FIG. 2 schematically shows another exemplary structure of the organic EL device according to the invention (second exemplary embodiment). In organic EL device 11, luminescent layer 30 includes first luminescent layer 32 and second luminescent layer 34, which are positioned in a layered manner.

In the following explanations, an anode is formed on support substrate 12 as lower electrode 14, but it is also possible to form a cathode on support substrate 12 as lower electrode 14.

—Luminescent Layer—

Luminescent layer 30 has a function of receiving holes from the anode, the hole-injection layer or the hole-transporting layer, while receiving electrons from the cathode, the electron-injection layer or the electron-transporting layer, and providing a place at which the holes and the electrons are re-combined, thereby emitting light.

Organic EL device 10 according to the first exemplary embodiment includes, in a single luminescent layer 30, a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level (T1) of 2.7 eV or more, the T1 of the hole-transporting material being higher than that of the blue phosphorescent material by 0.08 eV or more.

Organic EL device 10 according to the second exemplary embodiment includes first luminescent layer 32 and second luminescent layer 34 that are located adjacent to each other, and first luminescent layer 32 includes a blue phosphorescent material having a luminescence peak in a range of from 420 nm to less than 500 nm. On the other hand, second luminescent layer 34 includes a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level (T1) of 2.7 eV or more, the T1 of the hole-transporting material being higher than that of the blue phosphorescent material by 0.08 eV or more.

In organic EL device 11 according to the second exemplary embodiment, the charge-transporting material may be included in first luminescent layer 32, rather than second luminescent layer 34. Alternatively, the charge-transporting material may be included in both first luminescent layer 32 and second luminescent layer 34.

Exemplary phosphorescent materials used in the present invention include a complex including a transition metal atom or a lanthanoid atom.

Preferable examples of the transition metal atom include, but not particularly limited to, ruthenium, rhodium, palladium, tungsten, rhenium, osmium, iridium and platinum. Among these, rhenium, iridium and platinum are more preferred.

Examples of the ranthanoid atom include lanthanum, cerium, praseodymium, neodymium, samarium, europium, gadolinium, terbium, dysprosium, holmium, erbium, thulium, ytterbium, and ruthenium. Among these, neodymium, europium and gadolinium are preferred.

Exemplary ligands for the complex are described in G. Wildinson et al., Comprehensive Coordination Chemistry, published by Pergamon Press (1987); H. Yersin et al., Photochemistry and Photophysics of Coordination Compounds, published by Springer-Verlag (1987); and Akio Yamamoto et al, Organometallic Chemistry—Basic and Applications—, published by Shokabo Publishing Co., Ltd. (1982).

Specific examples of the ligand preferably include halogen ligands (preferably a chlorine ligand), nitrogen-containing heterocycle ligands (such as phenylpyridine, benzoquinoline, quinolinol, bipyridyl and phenanthroline), diketone ligands (such as acetylacetone), carboxylic acid ligands (such as acetic acid ligand), carbon monoxide ligands, isonitrile ligands, and cyano ligands. Among these, nitrogen-containing heterocycle ligands are more preferred.

The complex as mentioned above may have one metal atom therein, or may form a so-called polynuclear complex including two or more metal atoms. The complex may include different kinds of metal atoms.

Among these, examples of the complex suitably used for a luminescent material include the phosphorescent compounds described in U.S. Pat. Nos. 6,303,238, 6,097,147, WO00/57676, WO00/70655, WO01/08230, WO01/39234, WO01/41512, WO02/02714, WO02/15645, WO02/44189, JP-A No. 2001-247859, JP-A No. 2000-33561, JP-A No. 2002-117978, JP-A No. 2002-225352, JP-A No. 2002-235076, JP-A No. 2001-239281, JP-A No. 2002-170684, EP 1211257, JP-A No. 2002-226495, JP-A No. 2002-234894, JP-A No. 2001-247859, JP-A No. 2001-298470, JP-A No. 2002-173674, JP-A No. 2002-203678, JP-A No. 2002-203679, JP-A No. 2002-203679, JP-A No. 2004-357791, JP-A No. 2006-256999, and JP-A 2005-75341.

The phosphorescent materials that may be used in the invention includes electron-transporting phosphorescent material and hole-transporting phosphorescent material.

Examples of the electron-transporting phosphorescent material preferably include those having an electron affinity (Ea) of from 2.5 eV to 3.5 eV, and an ionization potential (Ip) of from 5.7 eV to 7.0 eV.

Preferable examples thereof include complexes of ruthenium, rhodium, palladium, tungsten, rhenium, osmium, iridium, platinum, lanthanum, cerium, praseodymium, neodymium, samarium, europium, gadolinium, terbium, dysprosium, holmium, erbium, thulium, ytterbium, and ruthenium. Among these, complexes of ruthenium, rhodium, palladium and platinum are more preferred, and platinum complexes are most preferred. Exemplary platinum complexes include the following, but the invention is not limited thereto.

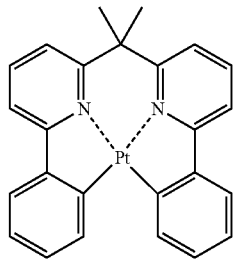

D-21

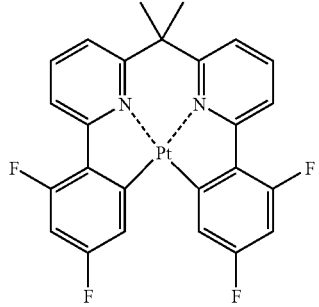

D-22

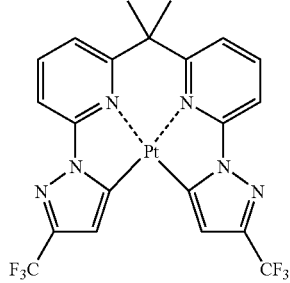

D-23

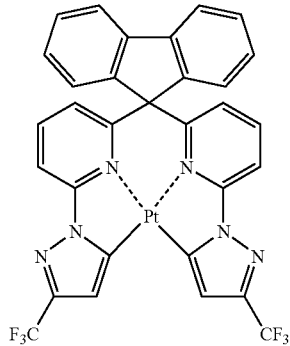

D-24

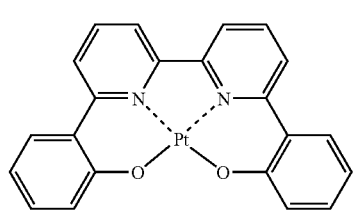

(1)

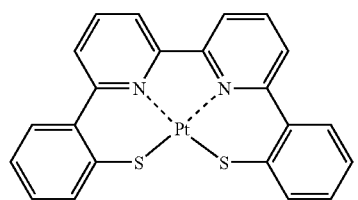 (2)
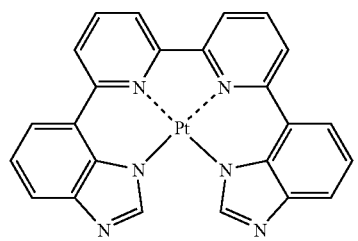 (3)
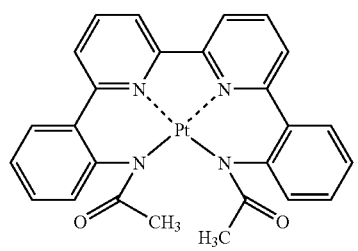 (4)
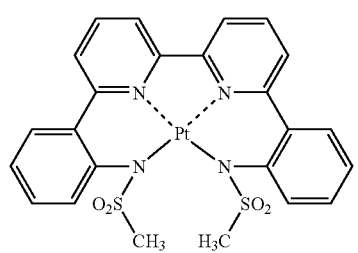 (5)
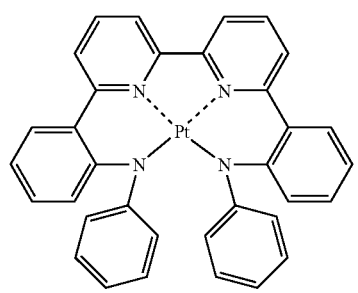 (6)
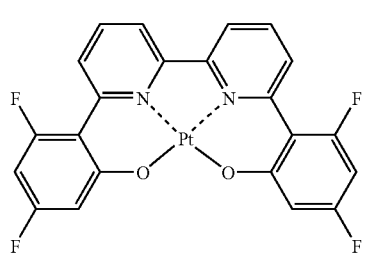 (12)
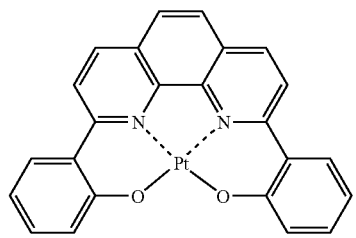 (13)
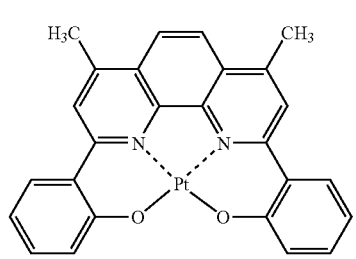 (14)
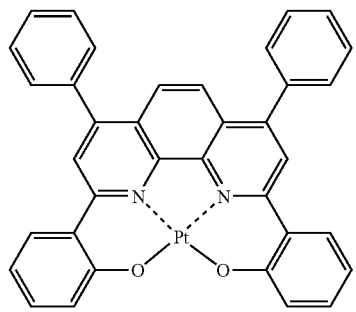 (15)
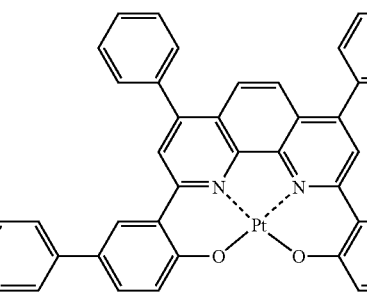 (16)
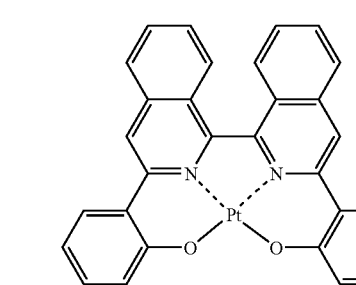 (17)
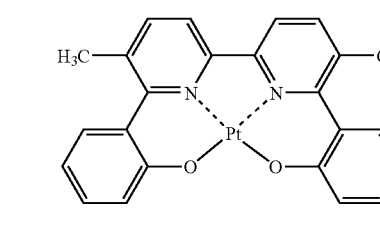 (18)

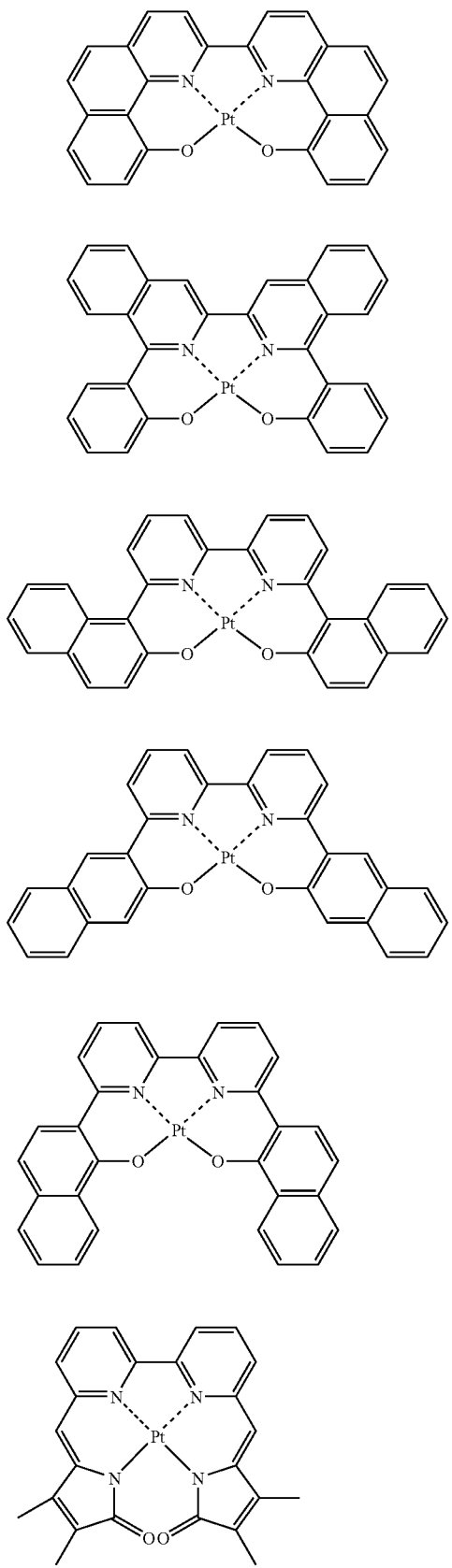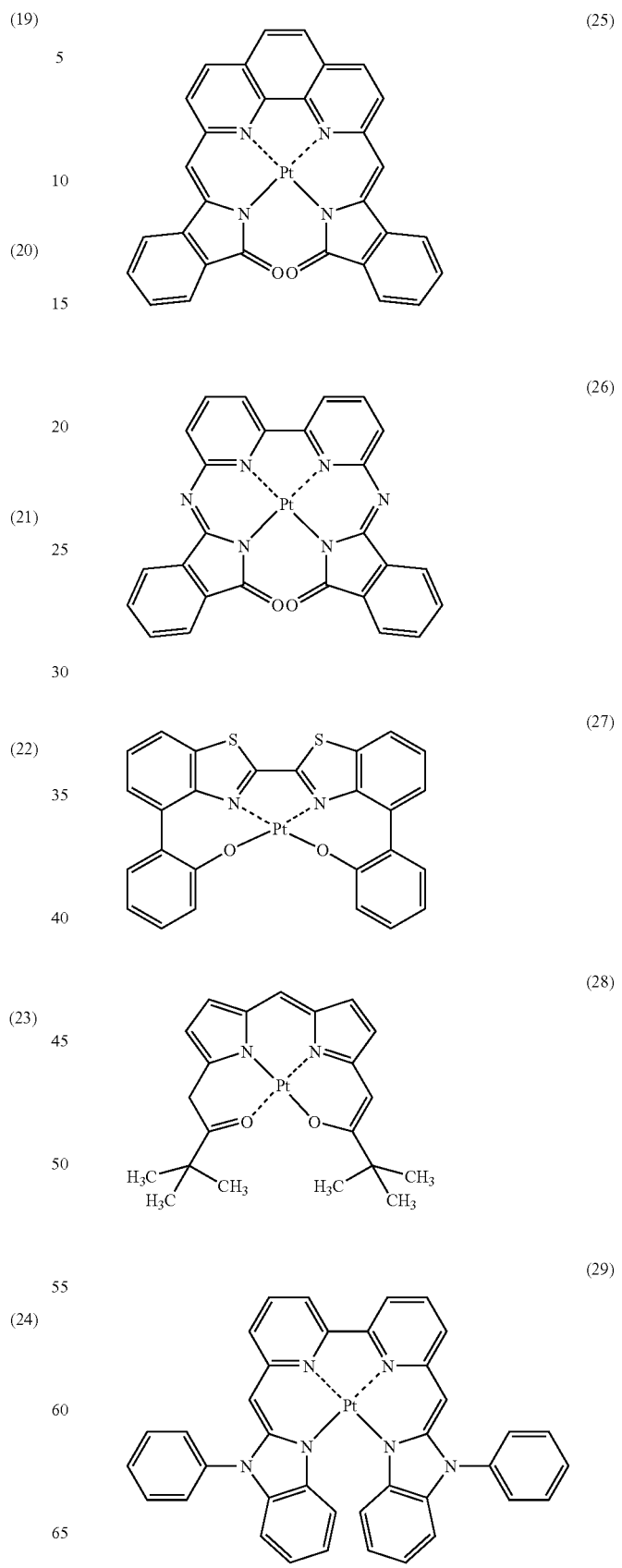

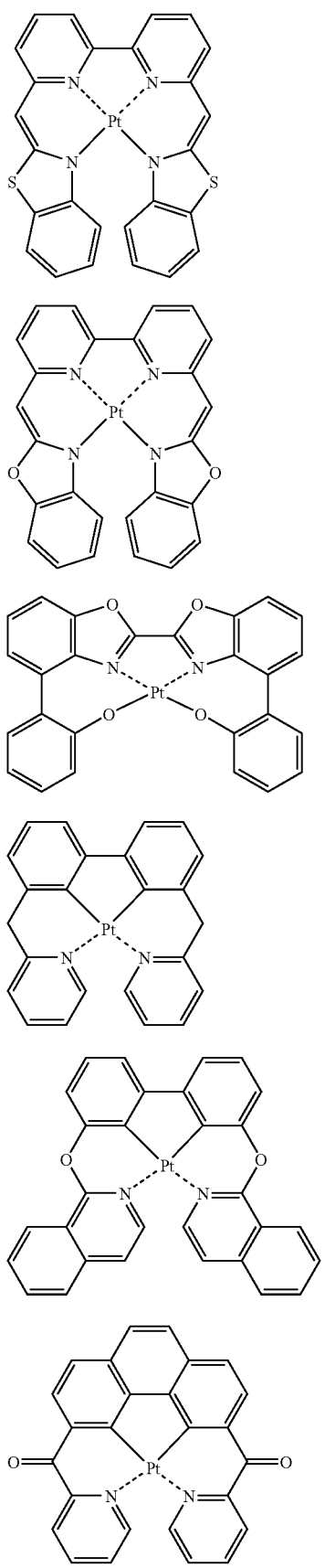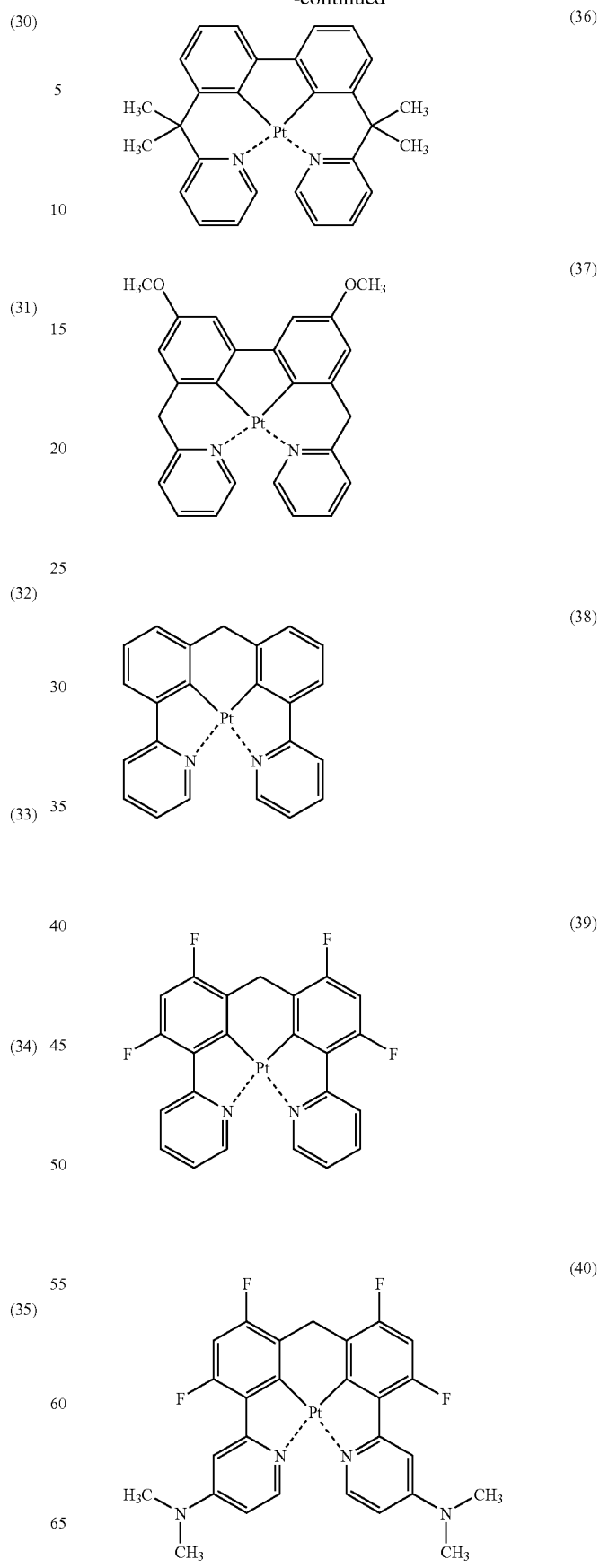

(41)
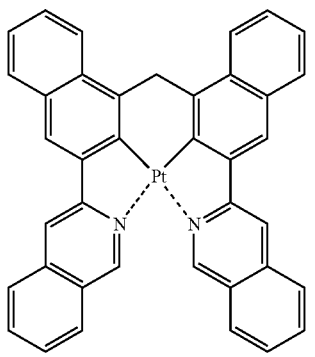
(42)
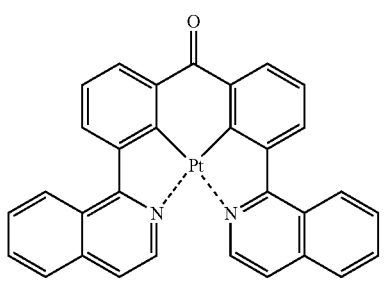
(43)
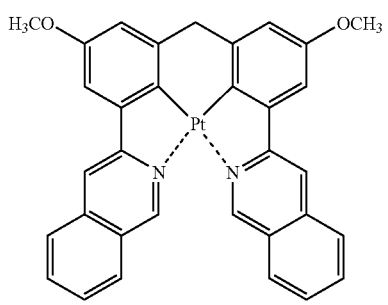
(44)
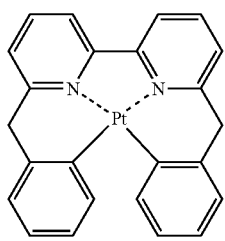
(45)
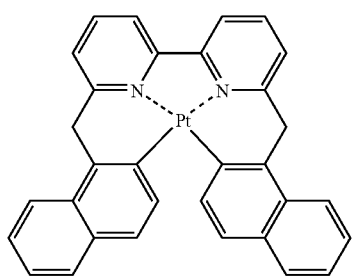
(46)
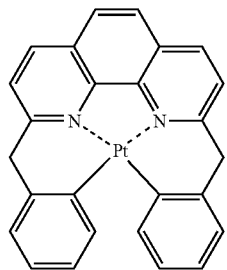
(47)
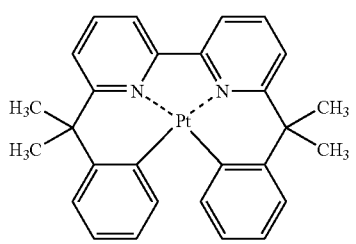
(48)
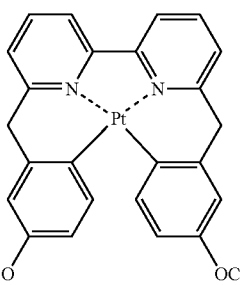
(49)
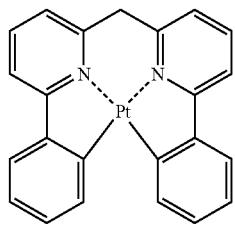
(50)
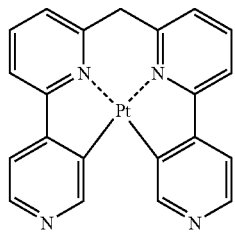
(51)
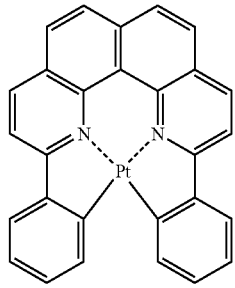

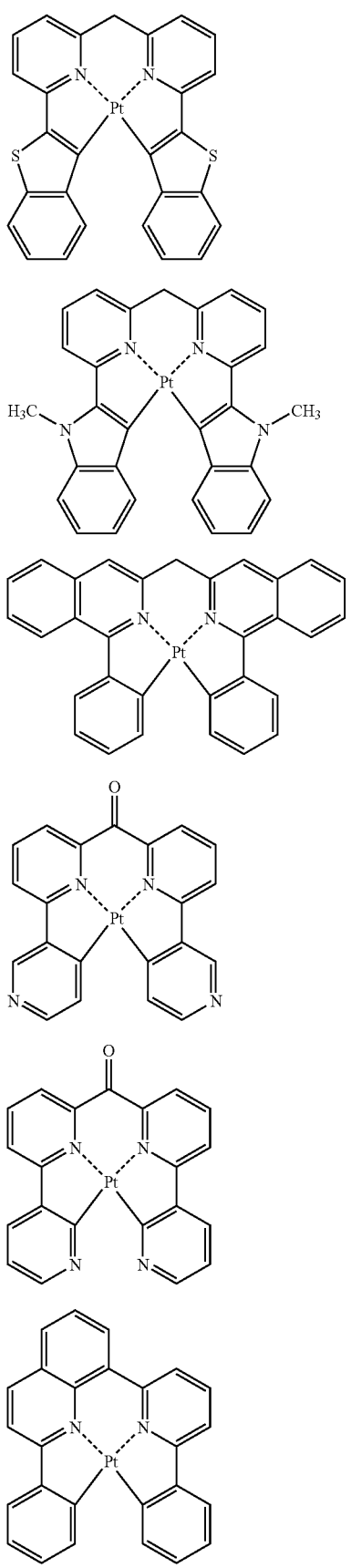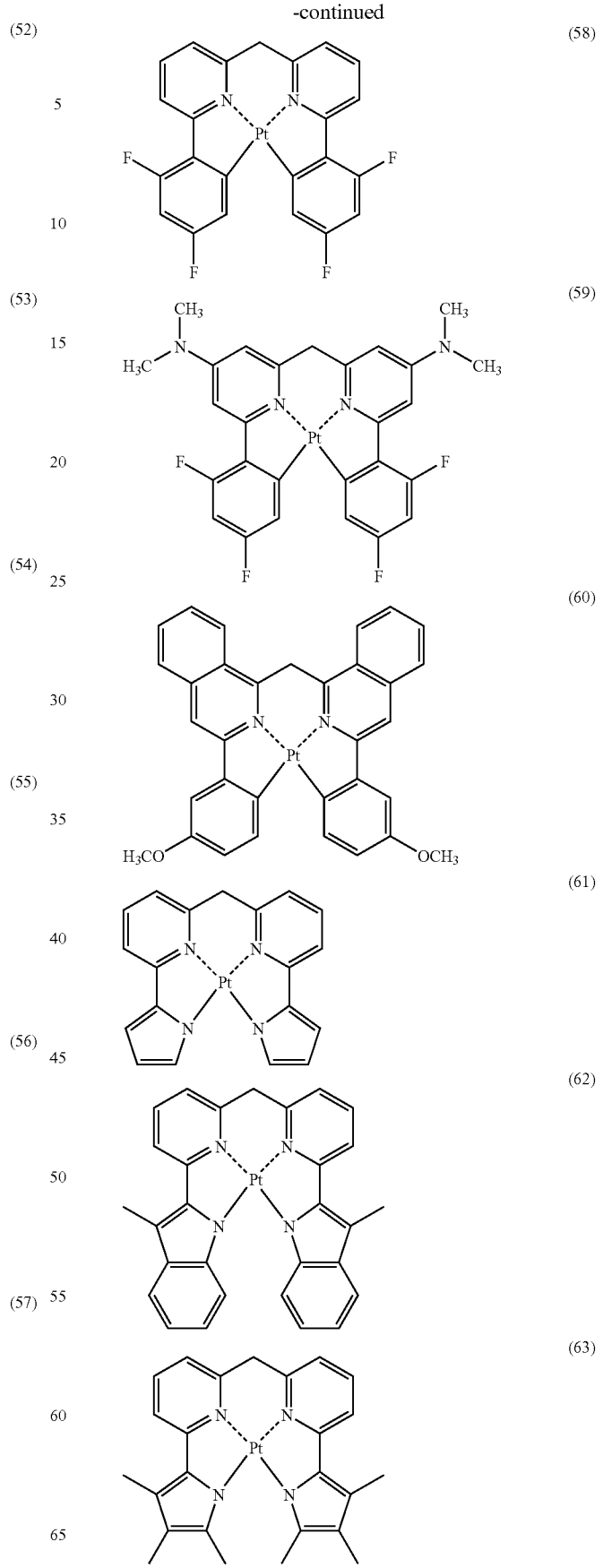

(64) 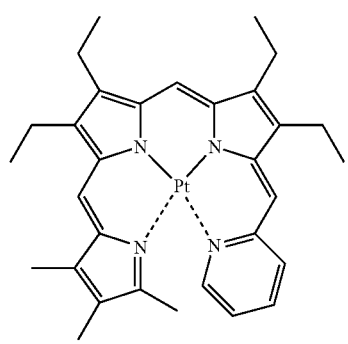
(65) 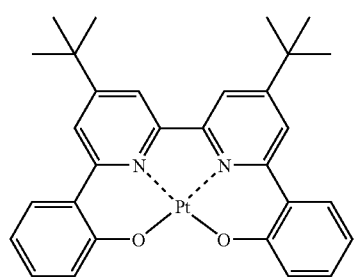
(66) 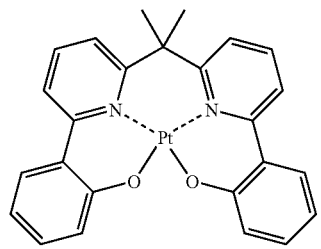
(67) 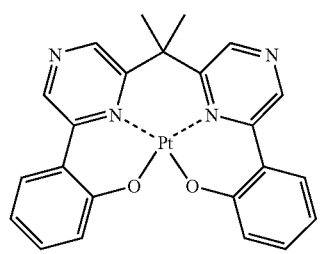
(68) 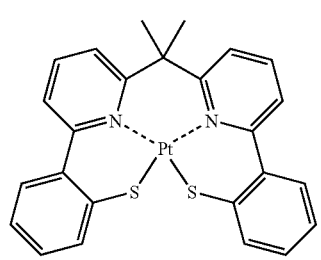
(69) 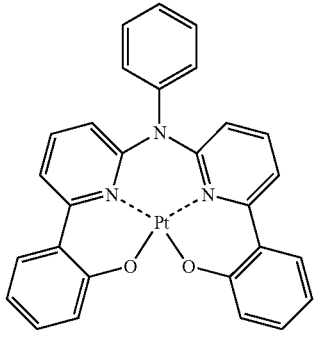
(70) 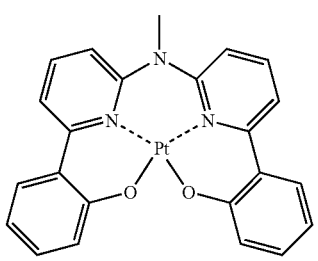
(71) 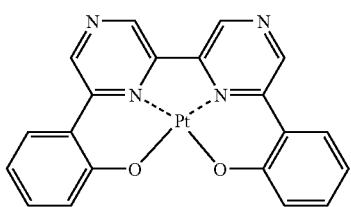
(72) 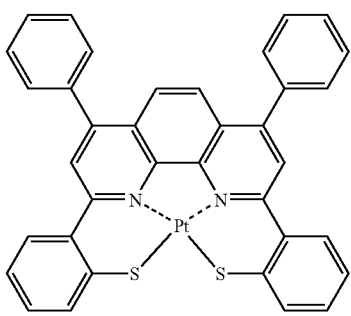
(73) 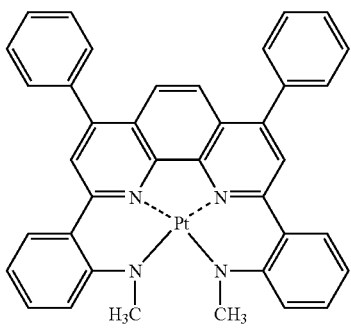

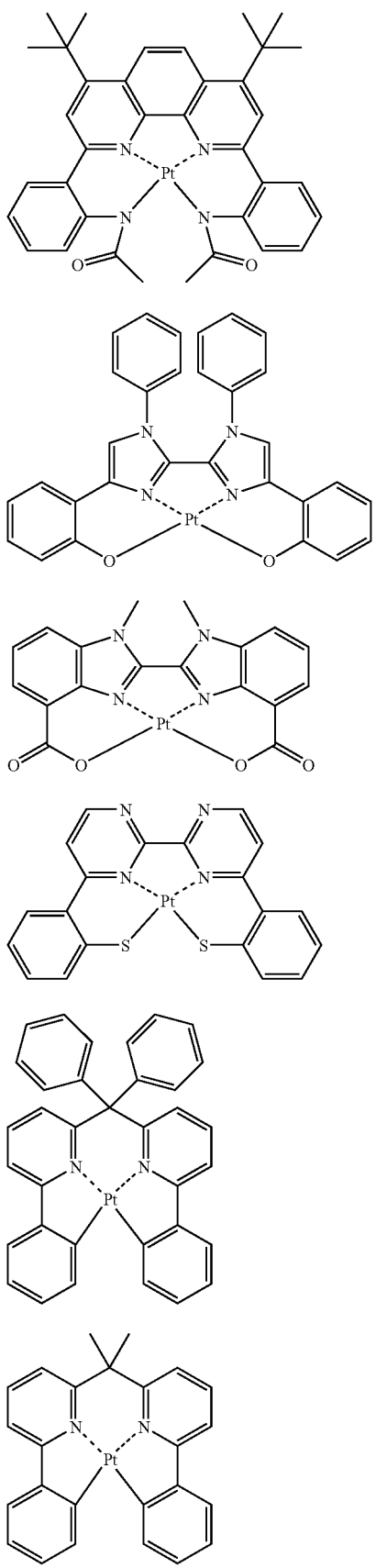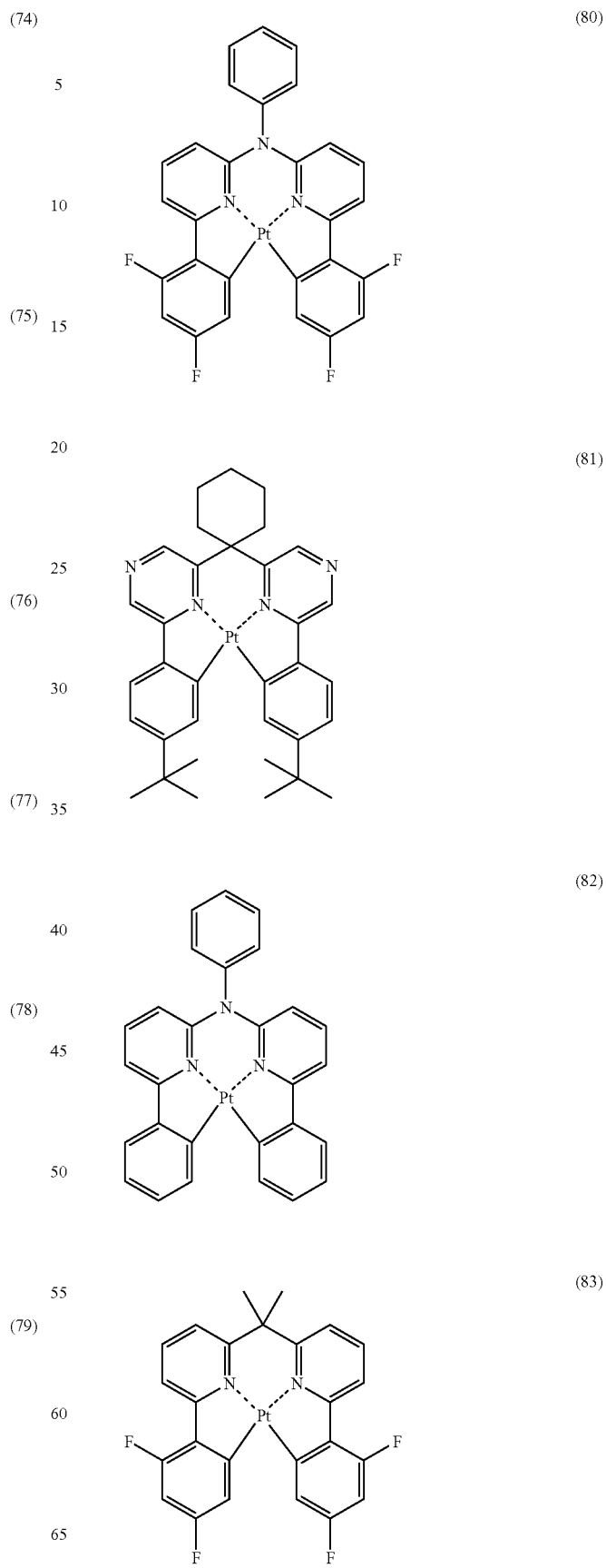

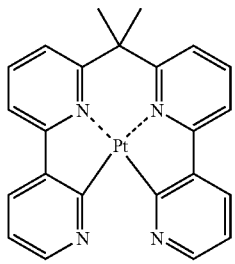
(84)
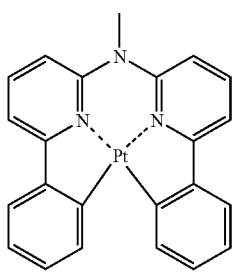
(85)
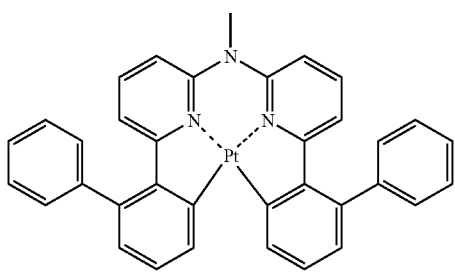
(86)
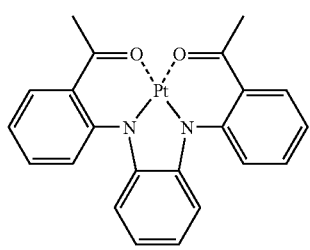
(87)
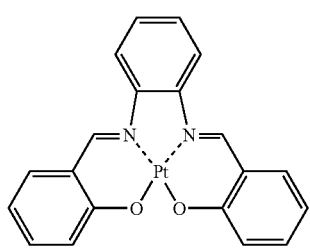
(88)
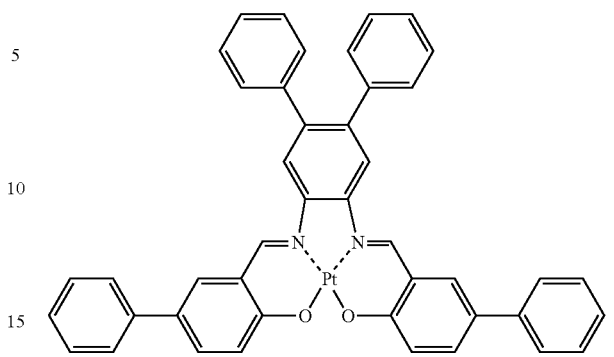
(89)
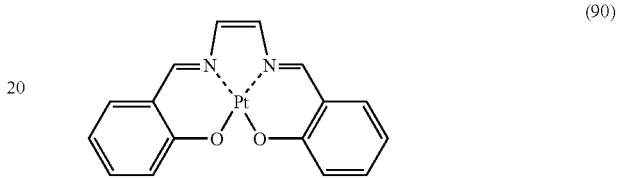
(90)
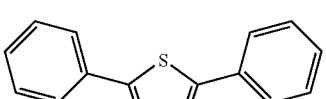
(91)
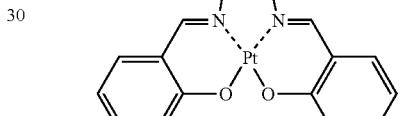
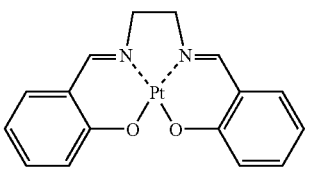
(92)
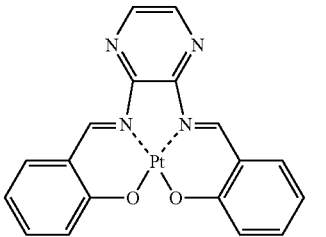
(93)
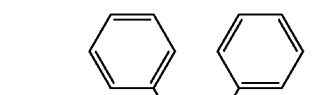
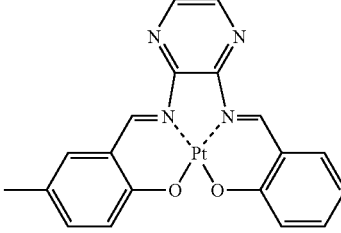
(94)

-continued

(95) 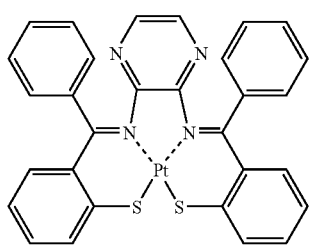

(96) 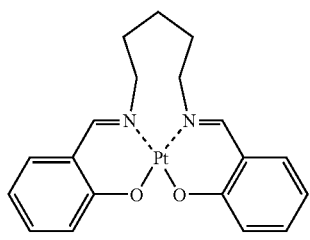

(97) 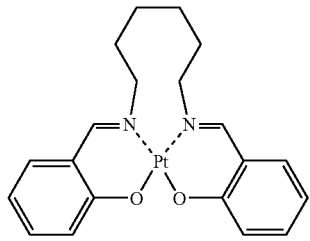

(98) 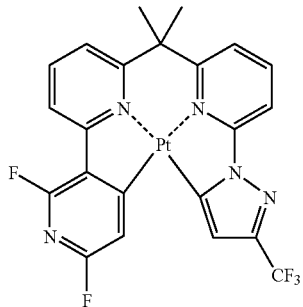

(99) 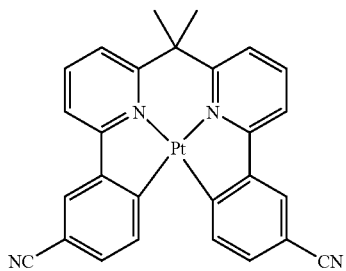

<Hole-Transporting Phosphorescent Material>
The phosphorescent material used in the invention may be a hole-transporting phosphorescent material.

Examples of the hole-transporting phosphorescent material preferably include those having an electron affinity (Ea) of from 2.4 eV to 3.4 eV, and an ionization potential (Ip) of from 5.0 eV to 6.3 eV.

Preferable examples thereof include complexes of ruthenium, rhodium, palladium, tungsten, rhenium, osmium, iridium, platinum, lanthanum, cerium, praseodymium, neodymium, samarium, europium, gadolinium, terbium, dysprosium, holmium, erbium, thulium, ytterbium, and ruthenium. Among these, iridium complexes are most preferred. Exemplary iridium complexes include the following, but the invention is not limited thereto.

D-1
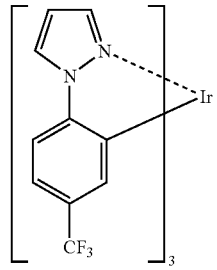

D-2
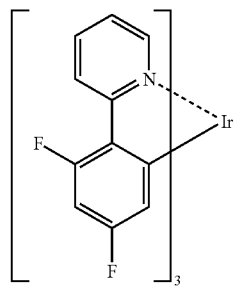

D-3
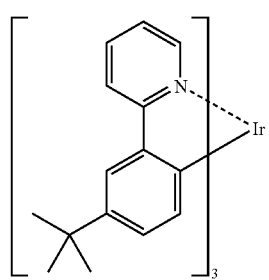

D-4
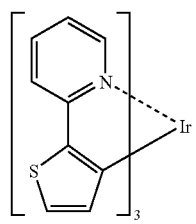

D-5
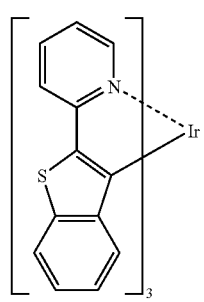

D-6 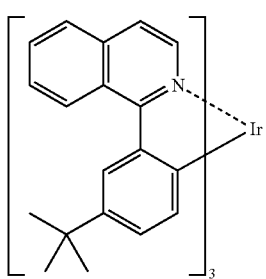
D-7 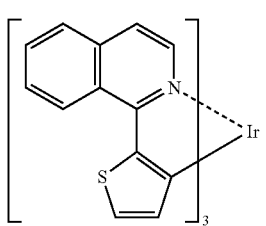
D-8 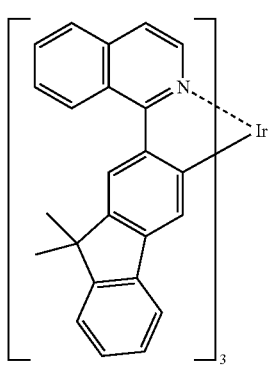
D-9 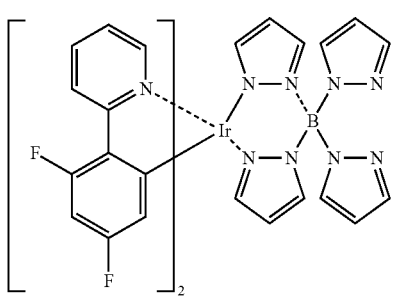
D-10 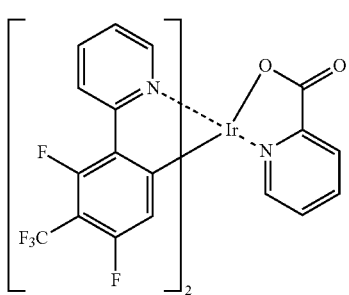
D-11 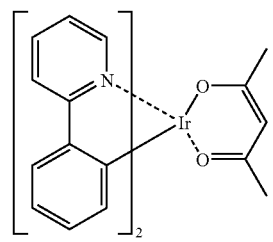
D-12 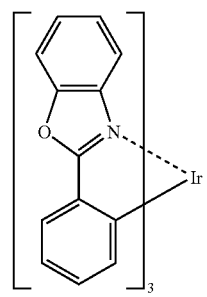
D-13 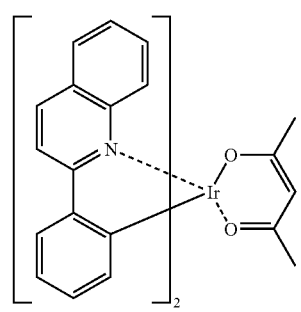
D-14 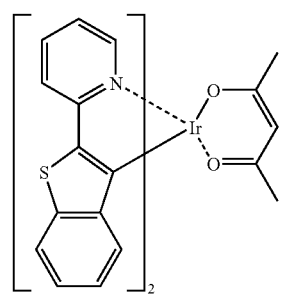
D-15 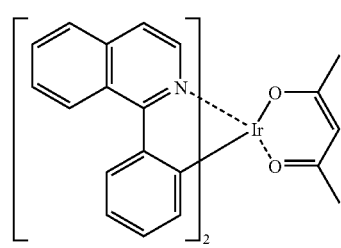

D-16

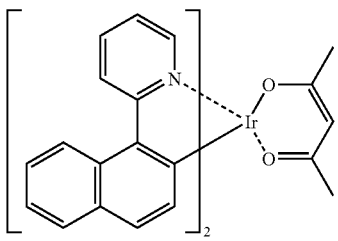

D-18

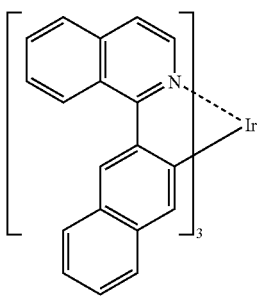

D-19

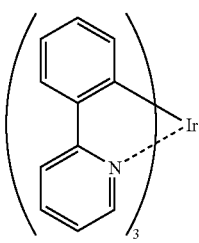

(Luminescent Layer)

Luminescent layer 30 according to the first exemplary embodiment includes a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level of 2.7 eV or more, the lowest excited triplet energy of the hole-transporting layer being higher than that of the blue phosphorescent material by 0.08 eV or more. The luminescent layer emits blue light, green light and red light.

Exemplary blue phosphorescent material having a peak wavelength in a range of from 420 nm to less than 500 nm (hereinafter, referred to as a blue phosphorescent material sometimes) include, but not limited thereto, the following compounds.

B-1

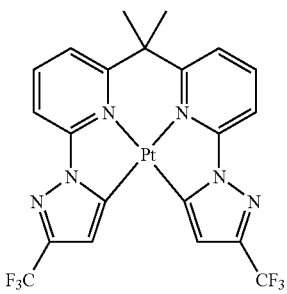

B-2

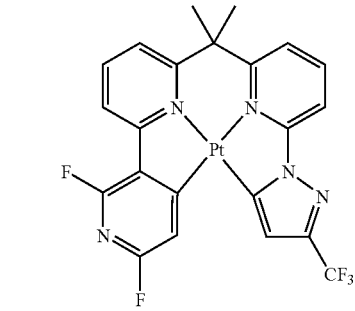

Exemplary green phosphorescent material having a luminescence peak in a range of from 500 nm to less than 570 nm (hereinafter, referred to as a green phosphorescent material sometimes) include, but not limited thereto, the following compounds.

G-1

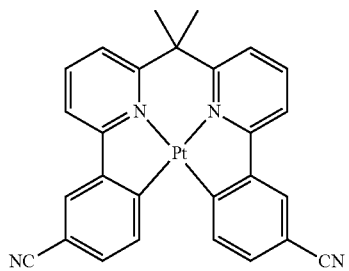

G-2

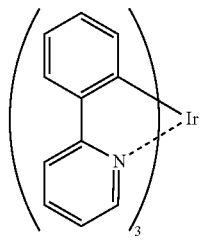

Exemplary red phosphorescent material having a luminescence peak in a range of from 570 nm to 650 nm (hereinafter, referred to as a red phosphorescent material sometimes) include, but not limited thereto, the following compounds.

R-1

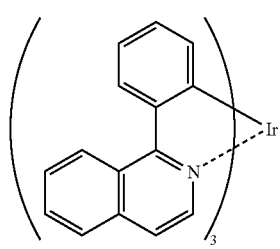

Luminescent layer 30 may include a combination of a blue phosphorescent material and either one of green phosphorescent material or red phosphorescent material, but is preferably formed by doping a phosphorescent material in a host material.

The host material that forms luminescent layer 30 is preferably a charge-transporting material. The host material may be used alone or in combination of two or more, for example, a combination of an electron-transporting host material and a hole-transporting host material.

The blue phosphorescent material is included in luminescent layer 30 preferably in an amount of from 5 to 30% by mass, more preferably in an amount of from 10 to 25% by mass. When the content of the blue phosphorescent material in luminescent layer 30 is 5% by mass or more, emission of blue light can be ensured and the dope amount thereof can be easily adjusted during the formation of luminescent layer 30. On the other hand, when the content of the blue phosphorescent material in luminescent layer 30 is 30% by mass or less, the blue color can be controlled not to be too strong with respect to the other colors (green and red), and an organic EL device that emits white light can be produced in a more reliable manner.

The content of the green phosphorescent material in luminescent layer 30 is preferably from 0.2 to 5% by mass, more preferably from 0.2 to 2% by mass.

The content of the red phosphorescent material in luminescent layer 30 is preferably from 0.2 to 5% by mass, more preferably from 0.2 to 2% by mass.

When the content of these phosphorescent materials are within the above range, emission of green light and red light can be ensured and the dope amount thereof can be easily adjusted during the formation of luminescent layer 30. Further, the green color and/or the red color can be controlled not to be too strong with respect to the blue color, and an organic EL device that emits white light can be produced in a more reliable manner.

Exemplary host materials included in luminescent layer 30 include those having a carbazole skeleton, a diarylamine skeleton, a pyridine skeleton, a pyrazine skeleton, a triazine skeleton, or an arylsilane skeleton. Further examples include materials as described in the subsequent explanations regarding the hole-injection layer, hole-transporting layer, electron-injection layer, and electron-transporting layer.

In particular, in order to suppress the energy transfer of excitons generated in luminescent layer 30 to the adjacent charge-transporting layers 20 and 40, luminescent layer 30 includes a charge-transporting material having a lowest excited triplet energy level (T1) of 2.7 eV or more, the lowest excited triplet energy level of the hole-transporting material being higher than that of the blue phosphorescent material by 0.08 eV or more. In order to suppress the energy transfer of excitons generated in luminescent layer 30 in a more effective manner, the T1 of the charge-transporting material in luminescent layer 30 is preferably 2.8 eV or more, more preferably 2.9 eV or more. Further, the difference between the T1 of the charge-transporting material in luminescent layer 30 and the T1 of the blue phosphorescent material ($\Delta$T1) is preferably 0.2 eV or more, more preferably 0.28 eV or more.

Moreover, in view of suppressing the degradation of charge transportability, the T1 of the above charge-transporting material is preferably 3.9 eV or less, more preferably 3.6 eV or less.

In order to suppress the energy transfer of excitons generated in luminescent layer 30 to the adjacent charge-transporting layers 20 and 40 in a more effective manner, the content of the charge-transporting material in luminescent layer 30 is preferably 60% by mass or more, more preferably 70% by mass or more, and further preferably 80% by mass or more. Two or more kinds of charge-transporting material may be included in luminescent layer 30. Specific examples of the charge-transporting material having a T1 of 2.7 eV or more will be described later.

The thickness of luminescent layer 30 is not particularly limited, but is preferably from 1 nm to 500 nm, more preferably from 5 nm to 200 nm, and further preferably from 10 nm to 100 nm, in view of improving the luminance efficiency, reducing the driving voltage, or the like.

In the second exemplary embodiment, a first luminescent layer 32 includes a blue phosphorescent material and a second luminescent layer 34 includes a green phosphorescent material and a red phosphorescent material, and at least one of first luminescent layer 32 or second luminescent layer 34 includes a charge-transporting material having a lowest excited triplet energy level (T1) of 2.7 eV or more, the lowest excited triplet energy level of the hole-transporting material being higher than that of the blue phosphorescent material by 0.08 eV or more. In the following, an exemplary embodiment in which the charge-transporting material is included in second luminescent layer 34 is described.

(1) First luminescent layer

First luminescent layer 32 includes a blue phosphorescent material having a luminescence peak in a range of from 420 nm to less than 500 nm, and emits blue light. Exemplary blue phosphorescent material having a peak wavelength within the above range include the aforementioned compounds B-1 and B-2, but the invention is not limited thereto.

First luminescent layer 32 may be formed only from a blue phosphorescent material, or may include two or more kinds of phosphorescent material having a luminescence peak in a range of from 420 nm to less than 500 nm, but first luminescent layer 32 is preferably formed by doping a blue phosphorescent material in a host material.

The host material that forms first luminescent layer 32 is preferably a charge-transporting material. The host material may be used alone or in combination of two or more kinds, for example, in combination of an electron-transporting host material and a hole-transporting host material.

The blue phosphorescent material is included in first luminescent layer 32 preferably in an amount of from 5 to 30% by mass, more preferably in an amount of from 10 to 25% by mass. When the content of the blue phosphorescent material in first luminescent layer 32 is 5% by mass or more, emission of blue light can be ensured and the dope amount thereof can be easily adjusted during the formation of first luminescent layer 32. On the other hand, when the content of the blue phosphorescent material in first luminescent layer 32 is 30% by mass or less, the blue color can be controlled not to be too strong with respect to the other colors (green and red), and an organic EL device that emits white light can be produced in a more reliable manner.

Exemplary host materials included in first luminescent layer 32 include those having a carbazole skeleton, a diarylamine skeleton, a pyridine skeleton, a pyrazine skeleton, a triazine skeleton, or an arylsilane skeleton. Further examples include materials as described in the subsequent explanations regarding the hole-injection layer, hole-transporting layer, electron-injection layer, and electron-transporting layer.

In particular, in order to suppress the energy transfer of excitons generated in first luminescent layer 32 to the adjacent second luminescent layer 34, first luminescent layer 32 preferably includes a charge-transporting material having a lowest excited triplet energy level (T1) of 2.7 eV or more, the lowest excited triplet energy level of the hole-transporting material being higher than that of the blue phosphorescent material by 0.08 eV or more. In order to suppress the energy transfer of the excitons generated in first luminescent layer 32 in a more effective manner, the T1 of the charge-transporting material is preferably 2.8 eV or more, more preferably 2.9 eV or more. Further, the difference between the T1 of the charge-transporting material included in first luminescent layer 32 and the T1 of the blue phosphorescent material (ΔT1) is preferably 0.2 eV or more, more preferably 0.28 eV or more.

Moreover, in view of suppressing the degradation of charge transportability, the T1 of the above charge-transporting material is preferably 3.9 eV or less, more preferably 3.6 eV.

In order to suppress the energy transfer of excitons generated in first luminescent layer 32 to the adjacent second luminescent layer 34 in a more effective manner, the content of the charge-transporting material in first luminescent layer 32 is preferably 60% by mass or more, more preferably 70% by mass or more, and further preferably 80% by mass or more. Two or more kinds of charge-transporting material may be included in first luminescent layer 32. Specific examples of the charge-transporting material having a T1 of 2.7 eV or more will be described later.

The thickness of first luminescent layer 32 is not particularly limited, but is preferably from 1 nm to 200 nm, more preferably from 5 nm to 100 nm, and further preferably from 10 nm to 70 nm, in view of improving the luminance efficiency, reducing the driving voltage, or the like.

(2) Second Luminescent Layer

Second luminescent layer 34 includes a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level (T1) of 2.7 eV or more, the lowest excited triplet energy level of the hole-transporting material being higher than that of the blue phosphorescent material included in first luminescent layer 32 by 0.08 eV or more. The second luminescent layer 34 emits green light and red light.

Exemplary green phosphorescent material having a luminescence peak in a range of from 500 nm to less than 570 nm include the aforementioned compounds G-1 and G-2, but the invention is not limited thereto.

The content of the green phosphorescent material in second luminescent layer 34 is preferably from 0.2 to 5% by mass, more preferably from 0.2 to 2% by mass. When the content of the green phosphorescent material in second luminescent layer 34 is 0.2% by mass or more, emission of green light can be ensured and the dope amount thereof can be easily adjusted during the formation of second luminescent layer 34. On the other hand, when the content of the green phosphorescent material in second luminescent layer 34 is 2% by mass or less, in particular, the green color can be controlled not to be too strong with respect to the other colors (blue and red), and an organic EL device that emits white light can be produced in a more reliable manner.

Exemplary red phosphorescent materials having a luminescence peak in a range of from 570 nm to 650 nm include the aforementioned compound R-1, but the invention is not limited thereto.

The content of the red phosphorescent material in second luminescent layer 34 is preferably from 0.2 to 5% by mass, more preferably from 0.2 to 2% by mass. When the content of the red phosphorescent material in second luminescent layer 34 is 0.2% by mass or more, emission of red light can be ensured and the dope amount thereof can be easily adjusted during the formation of second luminescent layer 34. On the other hand, when the content of the red phosphorescent material in second luminescent layer 34 is 2% by mass or less, in particular, the red color can be controlled not to be too strong with respect to the other colors (blue and green), and an organic EL device that emits white light can be produced in a more reliable manner.

Exemplary charge-transporting materials having a lowest excited triplet energy level (T1) of 2.7 eV or more that may be included in second luminescent layer 34 include the following compounds, but the invention is not limited thereto.

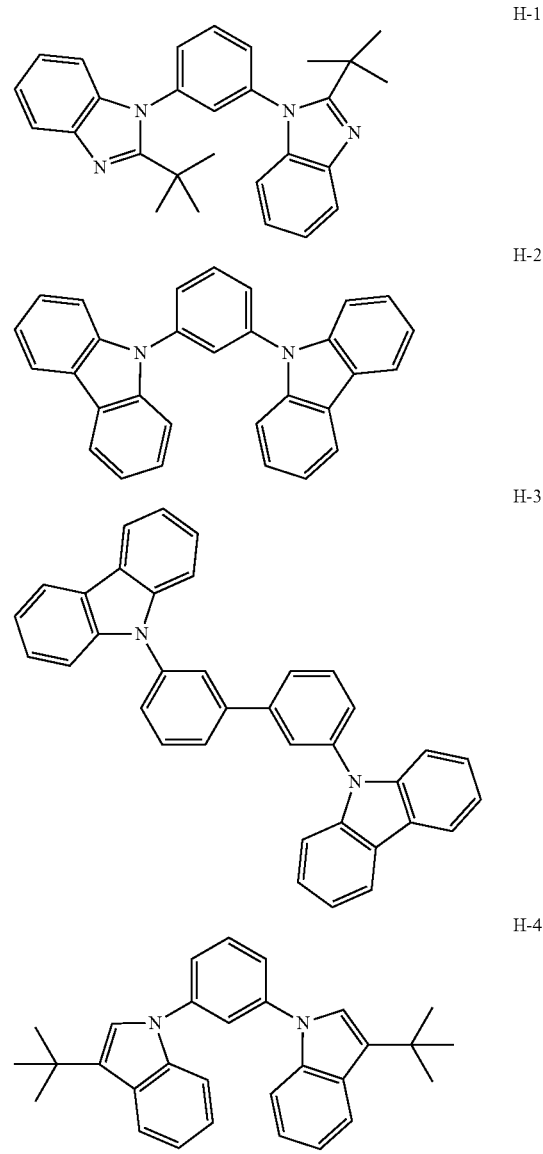

When the charge-transporting material having a T1 of 2.7 eV or more as defined above is included in second luminescent layer 34, transfer of excitons generated in first luminescent layer 32 to second luminescent layer 34 can be suppressed. In order to suppress the transfer of excitons from first luminescent layer 32 in a more effective manner, the charge-transporting material preferably has a T1 of 2.8 eV or more, more preferably 2.9 eV or more. Further, two or more kinds of charge-transporting material having a T1 of 2.7 eV or more may be included in second luminescent layer 34.

Moreover, in view of suppressing the charge transportability, the T1 of the above charge-transporting material included in second luminescent layer 34 is preferably 3.9 eV or less, more preferably 3.6 eV or less.

In order to effectively suppress the transfer of excitons from first luminescent layer 32, the content of the charge-transporting material included in second luminescent layer 34 is preferably 60% by mass or more, more preferably 70% by mass or more, and further preferably 80% by mass or more.

The thickness of second luminescent layer 34 is not particularly limited, but is preferably from 1 nm to 200 nm, more preferably from 5 nm to 100 nm, and further preferably from 10 nm to 70 nm, in view of improving the luminance efficiency, reducing the driving voltage, or the like.

The total thickness of luminescent layer 30, including first luminescent layer 32 and second luminescent 34, is preferably from 1 nm to 500 nm, more preferably from 5 nm to 200 nm, and further preferably from 10 nm to 100 nm, in view of improving the luminance efficiency, reducing the driving voltage, or the like. In particular, when the total thickness of luminescent layer 30 is 25 nm or more, the luminance efficiency and the durability can be improved, and when 35 nm or less, increase in the driving voltage can be suppressed.

The ratio of the thickness of first luminescent layer 32 (X) to the thickness of second luminescent layer 34 (Y) (X/Y) is preferably from 1 to 8, more preferably from 2 to 5. In particular, the ratio X/Y is preferably in a range of from 2 to 5 in view of achieving favorable durability and chromaticity.

First and second luminescent layers 32 and 34 may be formed by a known method, in addition to a dry method such as evaporation or sputtering, such as transferring, printing, inkjet or spraying.

In order to emit white light, the luminance intensity ratio (the ratio of minimum luminance spectrum to maximum luminance spectrum) of each phosphorescent material of blue, green and red is preferably from 5:95 to 1:1, more preferably from 20:80 to 40:60. In organic EL device 10 or 11 according to the invention, a luminescence peak appears in each luminescence region of RGB due to the suppressed energy transfer of excitons among these phosphorescent materials. In particular, when the luminance intensity ratio of the minimum luminance spectrum to the maximum luminance spectrum is within the above range, light emitted by each phosphorescent material is mixed with each other, thereby obtaining an organic EL device that emits white light with suppressed color irregularlities in a more reliable manner.

In organic EL device 11 of the second exemplary embodiment, luminescent layer 30 including first luminescent layer 32 and second luminescent layer 34 is positioned between anode 14 anode and cathode 16. However, an additional organic layer may also be positioned between anode 14 and luminescent layer 30 and/or between cathode 16 and luminescent layer 30. For example, as shown in FIG. 2, hole-transporting layer 20, luminescent layer 30 and electron-transporting layer 40 may be positioned in this order from the side of cathode 14. Further, a charge-blocking layer or the like may be positioned between hole-transporting layer 20 and luminescent layer 30 and/or between electron-transporting layer 40 and luminescent layer 30. A hole-injection layer may be positioned between anode 14 and hole-transporting layer 20, and/or an electron-injection layer may be positioned between cathode 16 and electron-transporting layer 40. Each of the layers as mentioned above may be formed of plural secondary layers.

—Hole-Injection Layer and Hole-Transporting Layer—

A hole-injection layer and a hole-transporting layer have a function of receiving holes from the anode of the anode side and transporting the same to the cathode side. These layers preferably include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, organic silane derivatives, carbon, metal complexes having phenylazole or phenylazine as a ligand, represented by Ir complexes, or the like.

The hole-injection layer and the hole-transporting layer preferably have a thickness of from 500 nm or less, respectively, from the viewpoint of reducing the driving voltage.

The thickness of the hole-transporting layer is preferably from 1 nm to 500 m, more preferably from 5 nm to 200 nm, and further preferably from 10 nm to 200 nm.

The thickness of the hole-injection layer is preferably from 0.1 nm to 200 nm, more preferably from 0.5 nm to 200 nm, and further preferably from 1 nm to 200 nm.

The hole-injection layer and the hole-transporting layer may have a monolayer structure formed of one or more kinds of the aforementioned material, or may have a multilayer structure formed of plural layers having the same or different compositions.

—Electron-Injection Layer and Electron-Transporting Layer—

An electron-injection layer and an electron-transporting layer have a function of receiving electrons from the cathode or the cathode side, and transporting the same to the anode side. These layers preferably include triazole derivatives, oxazole derivatives, oxadiazole derivatives, imidazole derivatives, fluorenone derivatives, anthraquinodimethane derivatives, anthorone derivatives, diphenylquinone derivative, thiopyrandioxide derivatives, carbodiimide derivatives, fluorenylidene methane derivatives, distyrylpyrazine derivatives, aromatic tetracarboxylic acid anhydrides such as naphthalene and perylene, phthalocyanine derivatives and metal complexes of 8-quinolinol derivatives, metal phthalocyanine, metal complexes having benzoxazole or benzthiazole as a ligand, organic silane derivatives, or the like.

The electron-injection layer and the electron-transporting layer preferably have a thickness of 500 nm or less, respectively, from the viewpoint of reducing the driving voltage.

The thickness of the electron-transporting layer is preferably from 1 nm to 500 m, more preferably from 5 nm to 200 nm, and further preferably from 10 nm to 100 nm.

The thickness of the electron-injection layer is preferably from 0.1 nm to 200 nm, more preferably from 0.2 nm to 100 nm, and further preferably from 0.5 nm to 50 nm.

The electron-injection layer and the electron-transporting layer may have a monolayer structure formed of one or more kinds of the aforementioned material, or may have a multilayer structure formed of plural layers having the same or different compositions.

—Hole-Blocking Layer—

A hole-blocking layer has a function of blocking the holes that have been transferred from the anode side to the luminescent layer from passing through toward the cathode side. The hole-blocking layer may be formed as an organic compound layer adjacent to the luminescent layer at the cathode side.

Exemplary organic compounds for the hole-blocking layer include aluminum complexes such as BAlq, triazole derivatives, and phenanthroline derivatives such as BCP.

The hole-blocking layer preferably has a thickness of from 1 nm to 500 nm, more preferably from 5 nm to 200 nm, and further preferably from 10 nm to 100 nm.

The hole-blocking layer may have a monolayer structure formed of one or more kinds of the aforementioned material, or may have a multilayer structure formed of plural layers having the same or different compositions.

The organic compound layers other than luminescent layer 30, as mentioned above, may also be formed by a known method, in addition to a dry method such as evaporation or sputtering, such as transferring, printing, coating, inkjet, spraying, or the like.

—Anode—

At least one of the pair of electrodes 14 and 16 is transparent in order to transmit light generated in luminescent layer 30. Typically, electrode 14 (lower electrode) at the side of support substrate 12 is an anode and electrode 16 (upper electrode) at the side of sealing substrate (not shown) is a cathode, but it is also possible to design lower electrode 14 as a cathode and upper electrode 16 as an anode.

The shape, structure or size of anode 14 is not particularly limited as long as it has a function of supplying holes to the organic EL layer, and may be appropriately selected based on the applications of the organic EL device.

Exemplary materials for anode 14 include metals, alloys, metal oxides, conductive compounds, or mixtures thereof. Specific examples thereof include semiconductor-type metal oxides, such as tin oxide doped with antimony, fluorine or the like (ATO, FTO or the like), tin oxide, zinc oxide, indium oxide, indium tin oxide (ITO), indium zinc oxide (IZO), metals such as gold, silver, chromium, nickel or the like, a mixture or a layered material of the above metal and a conductive metal oxide, inorganic conductive materials such as copper iodide, copper sulfide or the like, organic conductive materials such as polyaniline, polythiophene, polypyrrole or the like, or a layered material of the above organic conductive material and ITO. Among these, ITO is preferred in view of productivity, conductivity or transparency.

The method of forming anode 14 may be appropriately selected in view of suitability to the raw material for the anode, and examples thereof include a wet method such as printing or coating, a physical method such as vacuum evaporation, sputtering or ion plating, or a chemical method such as CVD or plasma CVD. For example, when ITO is selected as the raw material, the anode may be formed by direct-current or high-frequency sputtering, vacuum evaporation, ion plating or the like.

The position of anode 14 in the luminescent device may be selected as appropriate according to applications or usage of organic EL device 10 or 11. For example, anode 14 may be formed on the entire surface of support substrate 12, or on a portion of support substrate 12.

The patterning of anode 14 may be conducted by chemical etching such as photolithography, or by physical etching using laser beams. Further, the patterning may be conducted by performing vacuum evaporation or sputtering using a mask, a lift-off method, or a printing method.

The thickness of anode 14 may be selected as appropriate according to the type of the raw material or the like, but is typically from 10 nm to 50 µm, preferably from 50 nm to 20 µm.

The resistivity of anode 14 is preferably $10^3$ Ω/square or less, more preferably $10^2$ Ω/square or less, in order to ensure the supply of holes to the organic EL layer.

When light is taken out from the side of anode 14, the anode preferably has a transmittance of 60% or more, more preferably 70% or more. Details of a transparent anode are described in "New Development of Transparent Electrode Film", edited by Yutaka Sawada, published by CMC Publishing Co., Ltd. (1999), and the contents thereof may be applied to the present invention. When a plastic substrate having a low heat resistance is used, the anode is preferably formed using ITO or IZO at a temperature of 150° C. or less.

—Cathode—

Cathode 16 typically has a function of injecting electrons to the organic compound layer. The shape, structure or size of the cathode is not particularly limited, and may be selected from known electrodes as appropriate according to applications or usage of organic EL device 10 or 11. Exemplary materials for cathode 16 include metals, alloys, metal oxides, conductive compounds or a mixture thereof. Specific examples thereof include alkali metals (such as Li, Na, K and Cs), alkaline earth metals (such as Mg and Ca), gold, silver, lead, aluminum, sodium-potassium alloy, lithium-aluminum alloy, magnesium-silver alloy, indium, and rare earth metals such as ytterbium. These raw materials may be used alone, but preferably in combination of two or more kinds in view of achieving both stability and electron-injection suitability at the same time.

Among the above, an alkali metal or an alkaline earth metal is preferred in view of electron-injection suitability, while a material including aluminum as a main component is preferred in view of storage stability. The material including aluminum as a main component refers to pure aluminum, or an alloy or a mixture of aluminum with 0.01 to 10% by mass of an alkali metal or an alkaline earth metal (such as lithium-aluminum alloy or magnesium-aluminum alloy). Details of the material for cathode 16 are described in JP-A No. 2-15595 and JP-A No. 5-121172, and the contents thereof may be applied to the present invention.

The method of forming cathode 16 is not particularly limited, and may be formed by a known method. For example, the cathode may be formed on the substrate by a method selected as appropriate according to the suitability for its material, including a wet method such as printing or coating, a physical method such as vacuum evaporation, sputtering or ion plating, or a chemical method such as CVD or plasma CVD. For example, when cathode 16 is formed from a metal or the like, the cathode can be formed from one or more kinds of metal by performing sputtering, simultaneously or separately.

The thickness of cathode 16 may be selected as appropriate according to the raw material for the cathode or the direction of taking out light, but is typically about from 1 nm to 5 µm. Cathode 16 may be transparent or may not. When a transparent cathode 16 is desired, the cathode can be obtained by forming a thin film having a thickness of about 1 nm to 10 nm from the material for cathode 16, and then forming a layer of transparent conductive material such as ITO or IZO on the thin film.

The patterning of cathode 16 may be conducted by chemical etching such as photolithography, or by physical etching using laser beams. Alternatively, the cathode may be formed by vacuum evaporation or sputtering using a mask, a lift-off method, or a printing method. The position of cathode 16 is not particularly limited, and may be formed on the entire surface of the organic compound layer, or may be formed on a portion of the organic compound layer.

A dielectric layer having a thickness of from 0.1 nm to 5 nm may be formed from a fluoride, an oxide or the like of an alkali metal or an alkaline earth metal as mentioned above, in between cathode 16 and the organic compound layer. The dielectric layer may be regarded as a kind of electron-injection layer. The dielectric layer may be formed by vacuum evaporation, sputtering, ion plating, or the like.

—Support Substrate—

Support substrate 12 is not particularly limited as long as it can support the entire body of organic EL device and has heat-resistivity, strength, transmittance or the like. Specific examples thereof include inorganic materials such as YSZ (yttria-stabilized zirconia) or glass, organic materials such as polyesters (e.g., polyethylene terephthalate, polybutylene tetephthalate and polyethylene naphthalate), polystyrene, polycarbonate, polyether sulfone, polyarylate, polyimide, polycycloolefin, norbornene resin, and poly(chlorotrifluoroethylene).

When glass is used for support substrate 12, non-alkali glass is preferably used in order to reduce the elusion of ions from the glass. When soda-lime glass is used, a barrier coating of silica or the like is preferably formed thereon.

When an organic material is used for support substrate 12, the material preferably has excellent heat-resistance, dimension stability, solvent resistance, electric insulation property, and processability. When a plastic material is used for support substrate 12, a moisture proof layer or a gas barrier layer is preferably formed on one or both surfaces thereof, in order to suppress the permeation of moisture or oxygen. Suitable materials for the moisture proof layer or the gas barrier layer are inorganic materials such as silicon nitride or silicon oxide. The moisture proof layer or the gas barrier layer may be formed by high-frequency sputtering or the like.

When a thermoplastic material is used for support substrate 12, a hard coat layer, an undercoat layer or the like may be formed thereon, as necessary.

The shape, structure, size or the like of support substrate 12 is not particularly limited, and may be selected as appropriate according to applications of organic EL device 10 or 11. The shape of support substrate 12 is typically plate-like, in view of handleability or the ease of formation of the organic EL device. Support substrate 12 may have a monolayer structure or a multilayer structure. Further, support substrate 12 may be formed of a single member or formed of two or more members.

When producing a top emission-type organic EL device in which light is taken out from the side opposite to support substrate 12, support substrate 12 may be formed from a metal substrate of stainless steel, Fe, Al, Ni, Co, Cu or an alloy thereof, a silicon substrate or the like, since light is not taken out from the side of support substrate 12. When metal is used, support substrate 12 having a high degree of strength and a high degree of gas barrier property with respect to moisture or oxygen in the air can be obtained, even with reduced thickness. A metal substrate can be used for support substrate 12 by providing an insulating film that ensures electric insulation in between support substrate 12 and lower electrode 14.

—Protection Layer—

Organic EL device 10 or 11 may be protected by a protection layer. The material for the protection layer is not particularly limited as long as it has a function of preventing the entering of a substance that promotes deterioration of the device, such as moisture or oxygen, into the device.

Specific examples of the material include metals such as In, Sn, Pb, Au, Cu, Al, Ti or Ni, metal oxides such as MgO, SiO, $SiO_2$, $Al_2O_3$, GeO, NiO, CaO, BaO, $Fe_2O_3$, $Y_2O_3$ or $TiO_2$, metal nitrides such as $SiN_x$ or $SiN_xO_y$, metal fluorides such as $MgF_2$, LiF, $AlF_3$ or $CaF_2$, polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained by copolymerizing a monomer mixture including tetrafluoroethylene and at least one kind of comonomer, fluorine-containing copolymers having a cyclic structure in a copolymer main chain, water-absorbing materials having a water absorption of 1% or more, and moisture-proof materials having a water absorption of 0.1% or less.

The method of forming the protection layer is not particularly limited, and may be conducted by a vacuum evaporation method, a sputtering method, a reactive sputtering method, an MBE (Molecular Beam Epitaxy) method, a cluster ion beam method, an ion plating method, a plasma polymerization method (high-frequency excited ion plating method), a plasma CVD method, a laser CVD method, a thermal CVD method, a gas source CVD method, a coating method, a printing method, a transfer method, or the like.

—Sealing—

Organic EL device 10 or 11 may be sealed using a sealing member, such as a sealing container. Further, a water absorbing material or an inert liquid may be included in a space between the sealing container and the organic EL device.

The water absorbing material is not particularly limited, and examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and examples thereof include paraffins, fluid paraffins, fluorine-based solvents such as perfluoroalkane, perfluoroamine and perfluoroether, chlorine-based solvents, and silicone oils.

The organic EL device 10 or 11 according to the invention emits light by connecting electrodes 14 and 16 to an external wiring such as a control wring or a signal wiring. In this way, a luminescence apparatus having the organic EL device according to the invention can be produced. The driving method for the luminescence apparatus according to the invention is not particularly limited, and either a passive matrix system or an active matrix system is applicable.

The organic EL device 10 or 11 according to the invention emits light by applying a direct (an alternate component may be included, as necessary) voltage (typically from 2 to 15 V), or by applying a direct current.

The driving method described in JP-A Nos. 2-148687, 6-301355, 5-29080, 7-134558, 8-234685 and 8-241047, Japanese Patent No. 2784615, U.S. Pat. Nos. 5,828,429 and 6,023,308, and the like, may be applied to the method of driving the organic EL device 10 or 11 according to the invention.

—Applications—

The applications of the organic EL device 10 or 11 according to the invention is not particularly limited, and the organic EL device may be suitably used as display devices, displays, backlights, electrophotographic devices, illuminations, recording light sources, exposure light sources, reading light sources, signals, billboards, interior items, optical communication systems, or the like.

The following are exemplary embodiments of the invention. However, the invention is not limited thereto.

<1> An organic EL device comprising a pair of electrodes and at least one luminescent layer located between the pair of electrodes, the luminescent layer comprising a blue phosphorescent material having a luminescence peak in a range of from 420 nm to less than 500 nm, a green phosphorescent material having a luminescence peak in a range of from 500 nm to less than 570 nm, a red phosphorescent material having a luminescence peak in a range of from 570 nm to 650 nm, and a charge-transporting material, the charge-transporting material having a lowest excited triplet energy level (T1) of 2.7 eV or more, and the T1 of the charge-transporting material being higher than the T1 of the blue phosphorescent material by 0.08 eV or more.

<2> The organic EL device according to <1>, wherein the concentration of the green phosphorescent material and the concentration of the red phosphorescent material in the luminescent layer are each 0.2% by mass or more, respectively.

<3> The organic EL device according to <1>, wherein the concentration of the blue phosphorescent material in the luminescent layer is 5% by mass or more.

<4> The organic EL device according to <1>, wherein at least one of the blue phosphorescent material, the green phosphorescent material, or the red phosphorescent material is a platinum complex.

<5> The organic EL device according to <1>, wherein the T1 of the charge-transporting material is 2.8 eV or more.

<6> The organic EL device according to <1>, wherein the T1 of the charge-transporting material is higher than the T1 of the blue phosphorescent material by 0.2 eV or more.

<7> The organic EL device according to <1>, wherein the luminescent layer comprises a first luminescent layer and a second luminescent layer adjacent to each other,
the first luminescent layer comprising the blue phosphorescent material and the charge-transporting material, and
the second luminescent layer comprising the green phosphorescent material and the red phosphorescent material.

<8> The organic EL device according to <7>, wherein the concentration of the green phosphorescent material and the concentration of the red phosphorescent material in the luminescent layer are each 0.2% by mass or more, respectively.

<9> The organic EL device according to <7>, wherein the concentration of the blue phosphorescent material in the luminescent layer is 5% by mass or more.

<10> The organic EL device according to <7>, wherein at least one of the blue phosphorescent material, the green phosphorescent material, or the red phosphorescent material is a platinum complex.

<11> The organic EL device according to <7>, wherein the T1 of the charge-transporting material is 2.8 eV or more.

<12> The organic EL device according to <7>, wherein the T1 of the charge-transporting material is higher than the T1 of the blue phosphorescent material by 0.2 eV or more.

<13> The organic EL device according to <1>, wherein the luminescent layer comprises a first luminescent layer and a second luminescent layer adjacent to each other,
the first luminescent layer comprising the blue phosphorescent material, and
the second luminescent layer comprising the green phosphorescent material, the red phosphorescent material, and the charge-transporting material.

<14> The organic EL device according to <13>, wherein the concentration of the green phosphorescent material and the concentration of the red phosphorescent material in the luminescent layer are each 0.2% by mass or more, respectively.

<15> The organic EL device according to <13>, wherein the concentration of the blue phosphorescent material in the luminescent layer is 5% by mass or more.

<16> The organic EL device according to <13>, wherein at least one of the blue phosphorescent material, the green phosphorescent material, or the red phosphorescent material is a platinum complex.

<17> The organic EL device according to <13>, wherein the T1 of the charge-transporting material is 2.8 eV or more.

<18> The organic EL device according to <13>, wherein the T1 of the charge-transporting material is higher than the T1 of the blue phosphorescent material by 0.2 eV or more.

<19> A luminescence apparatus comprising the organic EL device according to <1>.

EXAMPLES

Hereinafter, the exemplary embodiments of the invention will be described according to the following Examples, but the invention is not limited thereto.

In the Examples, an organic EL device having the following standard structure was formed on a glass substrate. Each of the organic layers was formed using a vacuum evaporation apparatus ($1 \times 10^{-6}$ torr).

—Standard Structure of Organic EL Device—

The following is the standard structure of the organic EL device prepared in the Examples.

ITO (100 nm)/2-TNATA+1.0% F4-TCNQ (160 nm)/NPD (10 nm)/luminescent layer/BAlq (39 nm)/BCP (1 nm)/LiF (1 nm)/Al (100 nm)

In the above structure, ITO serves as an anode and Al serves as a cathode. The "%" represents the concentration of the material in each layer (% by mass), and the value described in the parenthesis represents the thickness of each layer. These layers were formed in the following manner, respectively.

1) Formation of Anode

A glass substrate having the size of 25 mm×25 mm×0.7 mm, on which indium tin oxide (ITO) was evaporated to a thickness of 100 nm (manufactured by Sanyo Vacuum Industries, Co., Ltd.), was used as a transparent support substrate. An anode is prepared by patterning the ITO film of the transparent support substrate by etching, and then washing the same.

2) Formation of Hole-Injection Layer and Hole-Transporting Layer

A hole-injection layer having a thickness of 160 nm was formed on the anode by performing co-evaporation of 4,4', 4"-tris(2-naphthylphenylamino)triphenylamine (2-TNATA) and 2,3,5,6-tetrafluoro-7,7,8,8-tetracyanoquinodimethane (F4-TCNQ), such that the content of Fe-TCNQ was 1.0% by mass with respect to 2-TNATA.

A hole-transporting layer having a thickness of 10 nm was formed on the hole-injection layer by evaporating N,N'-dinaphthyl-N,N'-diphenyl-[1,1'-biphenyl]-4,4'-diamine (α-NPD).

3) Formation of Luminescent Layer (Examples 1, 2, 6 and 7, Comparative Examples 1, 2, 4 and 5) A luminescent layer including three kinds of phosphorescent material each emit light in a range of blue, green and red was formed by evaporation.

(Examples 3, 4, 5, 8, 9, 10 and 11, Comparative Examples 3, 6 and 7) A first luminescent layer including a phosphorescent material that emits light in a range of blue, and a second luminescent layer including two kinds of phosphorescent material each emit light in a range of green and red were formed by evaporation, in this order.

4) Formation of Electron-Transporting Layer and Electron-Injection Layer—

An electron-transporting layer having a thickness of 39 nm was formed on the luminescent layer by evaporating aluminum (III) bis(2-methyl-8-quinolato)-4-phenylphenolate (BAlp).

An electron-injection layer having a thickness of 1 nm was formed on the electron-transporting layer by evaporating bathocuproin (BCP).

5) Formation of Cathode or the Like

A layer of LiF having a thickness of 1 nm was evaporated on the electron-injection layer. Subsequently, a layer of Al having a thickness of 100 nm was formed as a cathode by patterning using a shadow mask. Each layer was formed by resistance heating vacuum evaporation.

The layered structure as prepared above was placed in a glove box filled with nitrogen, and the glove box was sealed with a stainless sealing can and a UV-curable adhesive (trade name, XNR5516HV, manufactured by Nagase ChemteX Corporation).

Organic EL devices having the above standard structure, but having a luminescent layer of a different composition as mentioned below, were prepared. The structure of the material used in the luminescent layer and other properties of the Examples and the Comparative Examples are described in the following. The value of T1 (lowest excited triplet energy level) was determined from the rising wavelength of the phosphorescent light as measured.

H-1

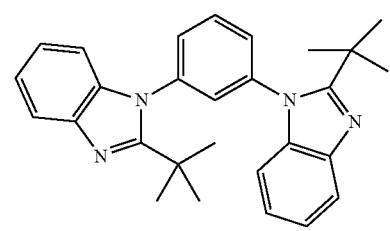

T1 = 3.10 eV

H-2

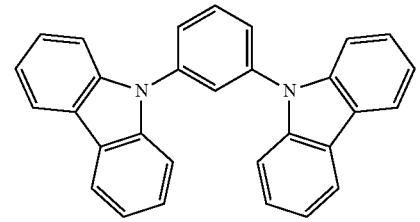

T1 = 2.89 eV

H-3

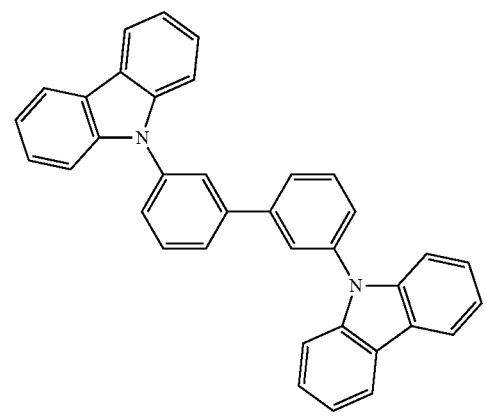

T1 = 2.86 eV

H-5

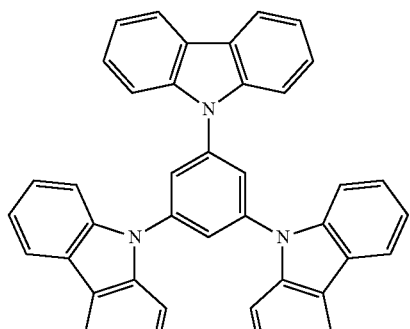

T1 = 2.82 eV

B-1

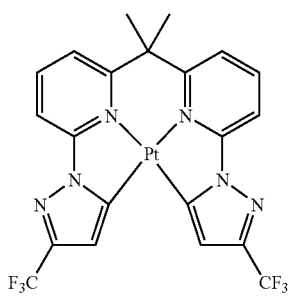

T1 = 2.82 eV
Luminescence peak: 456 nm

B-2

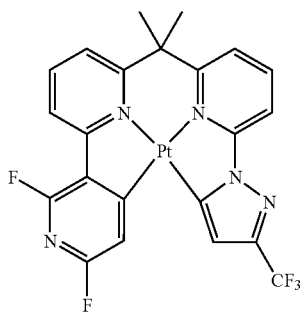

T1 = 2.74 eV
Luminescence peak: 466.8 nm

B-3

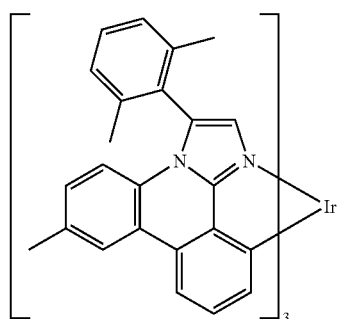

T1 = 2.76 eV
Luminescence peak: 463 nm

B-4

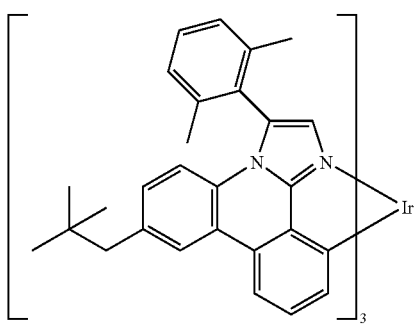

T1 = 2.75 eV
Luminescence peak: 465 nm

G-1

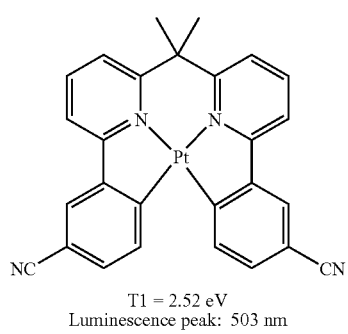

T1 = 2.52 eV
Luminescence peak: 503 nm

G-2

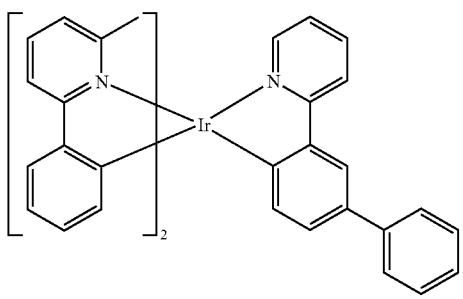

T1 = 2.52 eV
Luminescence peak: 517 nm

G-3

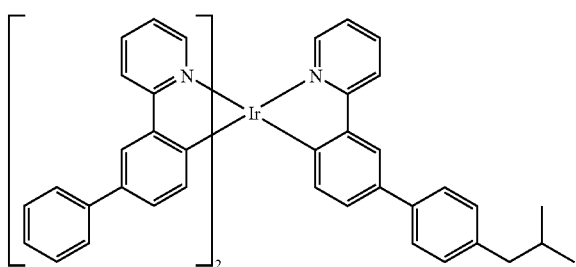

T1 = 2.47 eV
Luminescence peak: 522 nm

R-1

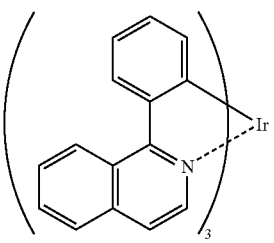

T1 = 2.07 eV
Luminescence peak: 620 nm

R-2

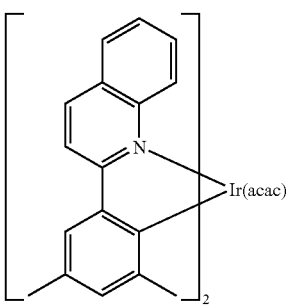

T1 = 2.07 eV
Luminescence peak: 620 nm

R-3

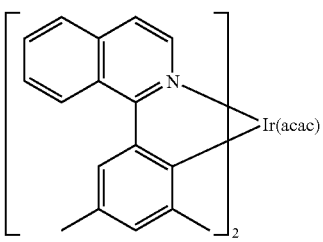

T1 = 2.03 eV
Luminescence peak: 635 nm

Example 1

An organic EL device having the above standard structure was prepared. The structure of the luminescent layer was as follows.

Luminescent layer: H-1+15% B-1+10% G-1+1% R-1 (30 nm)

The organic EL device emitted white light upon application of a direct voltage using a source measure unit (product type: 2400, manufactured by Toyo Corporation), and the luminance thereof was measured using a measurement device (product type: BM-8, manufactured by Topcon Corporation). The luminance spectrum and the wavelength were measured using a spectrum analyzer (product type: PMA-11, manufactured by Hamamatsu Photonics K.K.). As a result, luminescence peaks were observed at 456 nm, 503 nm and 620 nm, and the intensity ratio thereof was 0.7:1:0.8. The chromaticity based on the CIE 1931 chromaticity coordinate was (x, y)= (0.31, 0.36).

Example 2

An organic EL device having the above standard structure was prepared. The structure of the luminescent layer was as follows.

Luminescent layer: H-1+15% B-2+10% G-1+1% R-1 (30 nm)

The organic EL device emitted white light upon application of a direct voltage in the same manner as Example 1. The luminescence peaks were observed at 467 nm, 503 nm and 620 nm, and the intensity ratio thereof was 0.65:1:0.8. The chromaticity based on the CIE 1931chromaticity coordinate was (x, y)=(0.31, 0.34).

Example 3

An organic EL device having the above standard structure was prepared. The structure of the luminescent layer was as follows.
First luminescent layer: H-1+15% B-1 (20 nm)
Second luminescent layer: H-3+10% G-1+1% R-1 (10 nm)
The organic EL device emitted white light upon application of a direct voltage in the same manner as Example 1. The luminescence peaks were observed at 456 nm, 503 nm and 620 nm, and the intensity ratio thereof was 0.75:1:0.78. The chromaticity based on the CIE 1931chromaticity coordinate was (x, y)=(0.31, 0.36).

Example 4

An organic EL device having the above standard structure was prepared. The structure of the luminescent layer was as follows.
First luminescent layer: H-1+15% B-2 (20 nm)
Second luminescent layer: H-3+10% G-1+1% R-1 (10 nm)
The organic EL device emitted white light upon application of a direct voltage in the same manner as Example 1. The luminescence peaks were observed at 466.8 nm, 503 nm and 620 nm, and the intensity ratio thereof was 0.85:1:0.6. The chromaticity based on the CIE 1931chromaticity coordinate was (x, y)=(0.29, 0.35).

Example 5

An organic EL device having the above standard structure was prepared. The structure of the luminescent layer was as follows.
First luminescent layer: H-3+15% B-2 (20 nm)
Second luminescent layer: H-1+10% G-1+1% R-1 (10 nm)
The organic EL device emitted white light upon application of a direct voltage in the same manner as Example 1. The luminescence peaks were observed at 466.8 nm, 503 nm and 620 nm, and the intensity ratio thereof was 0.8:1:0.75. The chromaticity based on the CIE 1931chromaticity coordinate was (x, y)=(0.34, 0.35).

Example 6

An organic EL device having the above standard structure was prepared. The structure of the luminescent layer was as follows.
Luminescent layer: H-1+15% B-3+10% G-2+1% R-2 (30 nm)
The organic EL device emitted white light upon application of a direct voltage in the same manner as Example 1. The luminescence peaks were observed at 463 nm, 517 nm and 620 nm, and the intensity ratio thereof was 0.6:1:0.85. The chromaticity based on the CIE 1931chromaticity coordinate was (x, y)=(0.33, 0.38).

Example 7

An organic EL device having the above standard structure was prepared. The structure of the luminescent layer was as follows.
Luminescent layer: H-1+15% B-4+10% G-3+1% R-3 (30 nm)
The organic EL device emitted white light upon application of a direct voltage in the same manner as Example 1. The luminescence peaks were observed at 465 nm, 522 nm and 635 nm, and the intensity ratio thereof was 0.6:1:0.9. The chromaticity based on the CIE 1931chromaticity coordinate was (x, y)=(0.35, 0.38).

Example 8

An organic EL device having the above standard structure was prepared. The structure of the luminescent layer was as follows.
First luminescent layer: H-1+15% B-3 (20 nm)
Second luminescent layer: H-3+10% G-2+1% R-2 (10 nm)
The organic EL device emitted white light upon application of a direct voltage in the same manner as Example 1. The luminescence peaks were observed at 463 nm, 517 nm and 620 nm, and the intensity ratio thereof was 0.8:1:0.75. The chromaticity based on the CIE 1931chromaticity coordinate was (x, y)=(0.31, 0.32).

Example 9

An organic EL device having the above standard structure was prepared. The structure of the luminescent layer was as follows.
First luminescent layer: H-1+15% B-3 (20 nm)
Second luminescent layer: H-5+10% G-2+1% R-2 (10 nm)
The organic EL device emitted white light upon application of a direct voltage in the same manner as Example 1. The luminescence peaks were observed at 463 nm, 517 nm and 620 nm, and the intensity ratio thereof was 0.75:1:0.75. The chromaticity based on the CIE 1931chromaticity coordinate was (x, y)=(0.32, 0.33).

Example 10

An organic EL device having the above standard structure was prepared. The structure of the luminescent layer was as follows.
First luminescent layer: H-1+15% B-4 (20 nm)
Second luminescent layer: H-3+10% G-3+1% R-3 (10 nm)
The organic EL device emitted white light upon application of a direct voltage in the same manner as Example 1. The luminescence peaks were observed at 465 nm, 522 nm and 635 nm, and the intensity ratio thereof was 0.8:1:0.8. The chromaticity based on the CIE 1931chromaticity coordinate was (x, y)=(0.33, 0.32).

Example 11

An organic EL device having the above standard structure was prepared. The structure of the luminescent layer was as follows.
First luminescent layer: H-3+15% B-3 (20 nm)
Second luminescent layer: H-1+10% G-2+1% R-2 (10 nm)
The organic EL device emitted white light upon application of a direct voltage in the same manner as Example 1. The luminescence peaks were observed at 463 nm, 517 nm and 620 nm, and the intensity ratio thereof was 0.75:1:0.85. The chromaticity based on the CIE 1931chromaticity coordinate was (x, y)=(0.34, 0.33).

Comparative Example 1

An organic EL device having the above standard structure was prepared. The structure of the luminescent layer was as follows.

Luminescent layer: H-2+15% B-1+10% G-1+1% R-1 (30 nm)

The organic EL device emitted white light mixed with a strong red color at 360 cd/m², upon application of a direct voltage using a source measure unit (product type: 2400, manufactured by Toyo Corporation), and the luminance thereof was measured using a measurement device (product type: BM-8, manufactured by Topcon Corporation). The luminance spectrum, the wavelength and the chromaticity were measured using a spectrum analyzer (product type: PMA-11, manufactured by Hamamatsu Photonics K.K.). As a result, luminescence peaks were observed at 456 nm, 503 nm and 630 nm, and the intensity ratio thereof was 0.6:0.75:1. The chromaticity based on the CIE 1931chromaticity coordinate was (x, y)=(0.42, 0.35).

Comparative Example 2

An organic EL device having the above standard structure was prepared. The structure of the luminescent layer was as follows.
Luminescent layer: H-3+15% B-1+10% G-1+1% R-1 (30 nm)

The organic EL device emitted white light mixed with a strong red color upon application of a direct voltage in the same manner as Example 1. The luminescence peaks were observed at 456 nm, 503 nm and 620 nm, and the intensity ratio thereof was 0.3:0.7:1. The chromaticity based on the CIE 1931chromaticity coordinate was (x, y)=(0.45, 0.36).

Comparative Example 3

An organic EL device having the above standard structure was prepared. The structure of the luminescent layer was as follows.
First luminescent layer: H-3+15% B-1 (20 nm)
Second luminescent layer: H-3+10% G-1+1% R-1 (10 nm)

The organic EL device emitted white light mixed with a strong red color upon application of a direct voltage in the same manner as Example 1. The luminescence peaks were observed at 456 nm, 503 nm and 620 nm, and the intensity ratio thereof was 0.3:0.7:1. The chromaticity based on the CIE 1931chromaticity coordinate was (x, y)=(0.45, 0.36).

Comparative Example 4

An organic EL device having the above standard structure was prepared. The structure of the luminescent layer was as follows.
Luminescent layer: H-5+15% B-3+10% G-2+1% R-2 (30 nm)

The organic EL device emitted white light mixed with a strong red color upon application of a direct voltage in the same manner as Example 1. The luminescence peaks were observed at 463 nm, 517 nm and 620 nm, and the intensity ratio thereof was 0.4:0.7:1. The chromaticity based on the CIE 1931chromaticity coordinate was (x, y)=(0.47, 0.36).

Comparative Example 5

An organic EL device having the above standard structure was prepared. The structure of the luminescent layer was as follows.
Luminescent layer: H-5+15% B-4+10% G-3+1% R-3 (30 nm)

The organic EL device emitted white light mixed with a strong red color upon application of a direct voltage in the same manner as Example 1. The luminescence peaks were observed at 465 nm, 522 nm and 635 nm, and the intensity ratio thereof was 0.35:0.65:1. The chromaticity based on the CIE 1931chromaticity coordinate was (x, y)=(0.49, 0.35).

Comparative Example 6

An organic EL device having the above standard structure was prepared. The structure of the luminescent layer was as follows.
First luminescent layer: H-5+15% B-3 (20 nm)
Second luminescent layer: H-5+10% G-2+1% R-2 (10 nm)

The organic EL device emitted white light mixed with a strong red color upon application of a direct voltage in the same manner as Example 1. The luminescence peaks were observed at 463 nm, 517 nm and 620 nm, and the intensity ratio thereof was 0.5:0.9:1. The chromaticity based on the CIE 1931chromaticity coordinate was (x, y)=(0.45, 0.40).

Comparative Example 7

An organic EL device having the above standard structure was prepared. The structure of the luminescent layer was as follows.
First luminescent layer: H-5+15% B-4 (20 nm)
Second luminescent layer: H-5+10% G-3+1% R-3 (10 nm)

The organic EL device emitted white light mixed with a strong red color upon application of a direct voltage in the same manner as Example 1. The luminescence peaks were observed at 465 nm, 522 nm and 635 nm, and the intensity ratio thereof was 0.45:0.85:1. The chromaticity based on the CIE 1931chromaticity coordinate was (x, y)=(0.48, 0.39).

As shown above, the organic EL devices prepared in the Examples can suppress the energy transfer of excitons among the phosphorescent materials, by using a host material having a high level of T1. Therefore, the invention can provide an organic EL device that emits white light in a stable manner, without reducing the dope concentration.

The aforementioned explanation is not intended to limit the invention to the above exemplary embodiments of the Examples. For example, the organic EL device according to the invention may have a top emission-type structure, or may have a structure in which light is emitted from both sides.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic EL device comprising a pair of electrodes, and a first luminescent layer and a second luminescent layer adjacent to each other and located between the pair of electrodes,
    the first luminescent layer comprising, in one layer, a blue phosphorescent material having a luminescence peak in a range of from 420 nm to less than 500 nm and a charge-transporting material having a lowest excited triplet energy level (T1) of 2.7 eV or more, each of which is mixed within the entire first luminescent layer;
    the second luminescent layer comprising, in one layer, a green phosphorescent material having a luminescence peak in a range of from 500 nm to less than 570 nm and a red phosphorescent material having a luminescence peak in a range of from 570 nm to 650 nm, each of which is mixed within the entire second luminescent layer; and the T1 of the charge-transporting material being higher than the T1 of the blue phosphorescent material by 0.08 eV or more.

2. The organic EL device according to claim 1, wherein the concentration of the green phosphorescent material and the concentration of the red phosphorescent material in the second luminescent layer are each 0.2% by mass or more, respectively.

3. The organic EL device according to claim 1, wherein the concentration of the blue phosphorescent material in the first luminescent layer is 5% by mass or more.

4. The organic EL device according to claim 1, wherein at least one of the blue phosphorescent material, the green phosphorescent material, or the red phosphorescent material is a platinum complex.

5. The organic EL device according to claim 1, wherein the T1 of the charge-transporting material is 2.8 eV or more.

6. The organic EL device according to claim 1, wherein the T1 of the charge-transporting material is higher than the T1 of the blue phosphorescent material by 0.2 eV or more.

7. An organic EL device comprising a pair of electrodes, and a first luminescent layer and a second luminescent layer adjacent to each other and located between the pair of electrodes, the first luminescent layer comprising, in one layer, a blue phosphorescent material having a luminescence peak in a range of from 420 nm to less than 500 nm, which is mixed within the entire first luminescent layer;

the second luminescent layer comprising, in one layer, a green phosphorescent material having a luminescence peak in a range of from 500 nm to less than 570 nm, a red phosphorescent material having a luminescence peak in a range of from 570 nm to 650 nm, and a charge-transporting material having a lowest excited triplet energy level (T1) of 2.7 eV or more, each of which is mixed within the entire second luminescent layer; and the T1 of the charge-transporting material being higher than the T1 of the blue phosphorescent material by 0.08 eV or more.

8. The organic EL device according to claim 7, wherein the concentration of the green phosphorescent material and the concentration of the red phosphorescent material in the second luminescent layer are each 0.2% by mass or more, respectively.

9. The organic EL device according to claim 7, wherein the concentration of the blue phosphorescent material in the first luminescent layer is 5% by mass or more.

10. The organic EL device according to claim 7, wherein at least one of the blue phosphorescent material, the green phosphorescent material, or the red phosphorescent material is a platinum complex.

11. The organic EL device according to claim 7, wherein the T1 of the charge-transporting material is 2.8 eV or more.

12. The organic EL device according to claim 7, wherein the T1 of the charge-transporting material is higher than the T1 of the blue phosphorescent material by 0.2 eV or more.

* * * * *